US012641973B2

(12) United States Patent
Wei et al.

(10) Patent No.: US 12,641,973 B2
(45) Date of Patent: May 26, 2026

(54) DISPLAY APPARATUS

(71) Applicants: Yunnan Invensight Optoelectronics Technology Co., Ltd., Kunming (CN); BOE Technology Group Co., Ltd., Beijing (CN)

(72) Inventors: Junbo Wei, Beijing (CN); Shengji Yang, Beijing (CN); Pengcheng Lu, Beijing (CN); Kuanta Huang, Beijing (CN); Yuanlan Tian, Beijing (CN)

(73) Assignees: Yunnan Invensight Optoelectronics Technology Co., Ltd., Kunming (CN); BOE Technology Group Co., Ltd., Beijing (CN)

( * ) Notice: Subject to any disclaimer, the term of this patent is extended or adjusted under 35 U.S.C. 154(b) by 496 days.

(21) Appl. No.: 18/274,200

(22) PCT Filed: Dec. 23, 2021

(86) PCT No.: PCT/CN2021/140892
§ 371 (c)(1),
(2) Date: Jul. 25, 2023

(87) PCT Pub. No.: WO2023/115463
PCT Pub. Date: Jun. 29, 2023

(65) Prior Publication Data
US 2024/0090285 A1 Mar. 14, 2024

(51) Int. Cl.
*H10K 59/131* (2023.01)
*H10K 59/88* (2023.01)
(52) U.S. Cl.
CPC ........... *H10K 59/131* (2023.02); *H10K 59/88* (2023.02)
(58) Field of Classification Search
CPC ......... H10K 59/131; H10K 59/88; G09G 3/32
See application file for complete search history.

(56) References Cited

U.S. PATENT DOCUMENTS

2005/0184980 A1    8/2005  Sato et al.
2008/0012808 A1    1/2008  Kurahashi et al.
(Continued)

FOREIGN PATENT DOCUMENTS

CN      101105618 A    1/2008
CN      108121119 A    6/2018
(Continued)

OTHER PUBLICATIONS

International Search Report for PCT/CN2021/140892 Mailed Aug. 17, 2022.
European Search Report for 21968606.0 Mailed Mar. 19, 2024.

*Primary Examiner* — Thanhha S Pham
(74) *Attorney, Agent, or Firm* — Ling Wu; Stephen Yang; Ling and Yang Intellectual Property

(57) ABSTRACT

Disclosed is a display apparatus comprising a display area and a dummy area; the display area comprises multiple pixel driving circuits and multiple display light-emitting devices, and the display light-emitting devices at least comprise a display anode and a display cathode; the dummy region comprises a cathode voltage line, at least one dummy anode connection line and multiple dummy light-emitting devices, the dummy light-emitting devices at least comprise a dummy anode and a dummy cathode; the display cathode and the dummy cathode are both connected to the cathode voltage line, the display anode being connected to a pixel driving circuit, and the dummy anode is connected to a dummy anode connection line, the dummy anode connection line being configured to cause the voltage differential between the dummy anode and the dummy cathode to be less than the turn-on voltage of the dummy light-emitting device.

20 Claims, 12 Drawing Sheets

(56)  References Cited

U.S. PATENT DOCUMENTS

| | | | |
|---|---|---|---|
| 2018/0188616 A1 | 7/2018 | Jeong et al. | |
| 2018/0315357 A1 | 11/2018 | Nam et al. | |
| 2019/0198811 A1 | 6/2019 | Choi et al. | |
| 2020/0143741 A1 | 5/2020 | Tsuboi et al. | |
| 2022/0199733 A1 | 6/2022 | Zhang et al. | |
| 2022/0310723 A1 | 9/2022 | Wang et al. | |
| 2022/0310760 A1* | 9/2022 | Park | H10K 59/88 |
| 2022/0326558 A1 | 10/2022 | Long et al. | |

FOREIGN PATENT DOCUMENTS

| | | |
|---|---|---|
| CN | 209946604 U | 1/2020 |
| CN | 111223450 A | 6/2020 |
| CN | 111653601 A | 9/2020 |
| WO | 2021203358 A1 | 10/2021 |
| WO | 2021207930 A1 | 10/2021 |

* cited by examiner

DISPLAY APPARATUS

CROSS-REFERENCE TO RELATED APPLICATION

The present application is a U.S. National Phase Entry of International Application No. PCT/CN2021/140892 having an international filing date of Dec. 23, 2021. The entire contents of the above-identified application are hereby incorporated by reference.

TECHNICAL FIELD

The present disclosure relates to, but is not limited to, the field of display technologies, and more particularly, to a display apparatus.

BACKGROUND

Micro organic light emitting diodes (Micro OLEDs) are micro displays developed in recent years, region silicon-based OLED is one of them. The silicon-based OLED may implement not only active addressing of pixels, but also manufacturing of structures such as a pixel drive circuit on a silicon substrate, so as to facilitate reduction of system volume to implement lightweight. The silicon-based OLED, which is prepared using mature Complementary Metal Oxide Semiconductor (CMOS) integrated circuit technologies, has advantages such as a small size, a high Pixels Per Inch (PPI), a high refresh rate, etc., and is widely used in the near-eye display field of Virtual Reality (VR) or Augmented Reality (AR).

SUMMARY

The following is a summary of subject matters described in the present disclosure in detail. The summary is not intended to limit the protection scope of claims.

An embodiment of the present disclosure provides a display apparatus including a display region and a dummy region located on at least one side of the display region, wherein the display region includes a plurality of pixel drive circuits and a plurality of display light emitting devices, a display light emitting device includes a display anode, a display cathode, and a display emitting layer disposed between the display anode and the display cathode; the dummy region includes a cathode voltage line, at least one dummy anode connection line, and a plurality of dummy light emitting devices, a dummy light emitting device includes a dummy anode, a dummy cathode, and a dummy emitting layer disposed between the dummy anode and the dummy cathode; both the display cathode and the dummy cathode are connected with the cathode voltage line, the display anode is connected with a pixel drive circuit, the dummy anode is connected with the dummy anode connection line, and the dummy anode connection line is configured such that a voltage difference between the dummy anode and the dummy cathode is less than a light-up voltage of the dummy light emitting device.

In an exemplary implementation mode, the dummy anode connection line is connected with the cathode voltage line.

In an exemplary implementation mode, the dummy anode connection line is in a shape of a strip extending along a first extension direction, a plurality of dummy anode connection lines are disposed in sequence along a second extension direction, the first extension direction is a direction away from the display region, and the second extension direction is a direction perpendicular to the first extension direction.

In an exemplary implementation mode, the dummy anode connection line includes a first connection line and a second connection line with different extension lengths, and the first connection line and the second connection line are disposed alternately along the second extension direction.

In an exemplary implementation mode, the display apparatus further includes a transition region, the transition region is located between the display region and the dummy region, the transition region includes a transition anode connection line and a plurality of transition light emitting devices, a transition light emitting device includes a transition anode, a transition cathode, and a transition emitting layer disposed between the transition anode and the transition cathode, the transition cathode is connected with the cathode voltage line, the transition anode is connected with the transition anode connection line, the transition anode connection line is a monolithic metal layer extending along a column direction, and the transition anode connection line is configured such that a voltage difference between the transition anode and the transition cathode is less than a light-up voltage of the transition light emitting device.

In an exemplary implementation mode, the transition anode connection line is connected with the cathode voltage line.

In an exemplary implementation mode, a width of the transition anode connection line is greater than a width of the cathode voltage line.

In an exemplary implementation mode, a width of the transition anode connection line is greater than a width of the dummy anode connection line.

In an exemplary implementation mode, a width of the transition anode connection line is greater than a width of the transition anode.

In an exemplary implementation mode, a length of the transition anode connection line is less than an extension length of the cathode voltage line.

In an exemplary implementation mode, a length of the transition anode connection line is greater than an extension length of the dummy anode connection line.

In an exemplary implementation mode, a width of the dummy anode connection line is less than a width of the cathode voltage line.

In an exemplary implementation mode, a quantity of dummy light emitting devices in the dummy region is different from a quantity of transition light emitting devices in the transition region.

In an exemplary implementation mode, a quantity of dummy light emitting devices in the dummy region is greater than a quantity of transition light emitting devices in the transition region.

In an exemplary implementation mode, an orthographic projection of at least one dummy light emitting device on a plane of the display apparatus is at least partially overlapped with an orthographic projection of the transition anode connection line on the plane of the display apparatus.

In an exemplary implementation mode, an orthographic projection of at least one transition light emitting device on a plane of the display apparatus is not overlapped with an orthographic projection of the dummy anode connection line on the plane of the display apparatus.

In an exemplary implementation mode, the transition anode is connected with the transition anode connection line through a transition anode via, and the dummy anode is connected with the dummy anode connection line through a dummy anode via, and the dummy anode via and the transition anode via are not on a same straight line along a row direction.

In an exemplary implementation mode, on both sides of the display apparatus in a row direction, the transition region and the dummy region include three columns of light emitting devices, and each column of light emitting devices includes a plurality of dummy light emitting devices or a plurality of transition light emitting devices disposed in sequence along a column direction.

In an exemplary implementation mode, on both sides of the display apparatus in a column direction, the dummy region includes two rows of light emitting devices, and each row of light emitting devices includes a plurality of dummy light emitting devices disposed in sequence along a row direction.

In an exemplary implementation mode, on a plane perpendicular to the display apparatus, the display apparatus includes a silicon substrate, a drive circuit layer disposed on the silicon substrate, and a light emitting structure layer disposed on one side of the drive circuit layer away from the silicon substrate; the drive circuit layer includes a first conductive layer, a second conductive layer, a third conductive layer, a fourth conductive layer, a fifth conductive layer, a sixth conductive layer, a seventh conductive layer, and an eighth conductive layer disposed in sequence on the silicon substrate, and the cathode voltage line is disposed in the eighth conductive layer.

In an exemplary implementation mode, the transition anode connection line, the dummy anode connection line, and the cathode voltage line are disposed in a same layer.

In an exemplary implementation mode, the drive circuit layer in the display region includes a plurality of repetitive units, at least one repetitive unit includes a plurality of pixel drive circuits, at least one pixel drive circuit includes a first transistor, a second transistor, a third transistor, and a storage capacitor, a control electrode of the first transistor is connected with a scan signal line, a first electrode of the first transistor is connected with a data signal line, a control electrode of the second transistor is connected with a reference signal line, a control electrode of the third transistor is connected with a first capacitor plate of the storage capacitor, a first electrode of the third transistor is connected with a first power supply line, and a second capacitor plate of the storage capacitor is connected with the cathode voltage line; the scan signal line and the reference signal line are disposed in the second conductive layer, the data signal line is disposed in the third conductive layer, and the first power supply line is disposed in the fourth conductive layer.

In an exemplary implementation mode, in the repetitive unit, the first capacitor plate of the storage capacitor of the at least one pixel drive circuit is disposed in the fifth conductive layer, and the second capacitor plate of the storage capacitor is disposed in the sixth conductive layer.

In an exemplary implementation mode, in the repetitive unit, the first capacitor plate of the storage capacitor of the at least one pixel drive circuit is disposed in the seventh conductive layer, and the second capacitor plate of the storage capacitor is disposed in the sixth conductive layer.

Other aspects may become apparent after accompanying drawings and detailed description are read and understood.

BRIEF DESCRIPTION OF DRAWINGS

The accompanying drawings are intended to provide an understanding of technical solutions of the present application and constitute a part of the specification, and are used for explaining the technical solutions of the present disclosure together with embodiments of the present disclosure, and not intended to constitute limitations on the technical solutions of the present disclosure. A shape and size of each component in the drawings do not reflect a true proportion, and are only intended to schematically illustrate contents of the present disclosure.

REFERENCE SIGNS ARE DESCRIBED AS FOLLOWS

Figure 1:
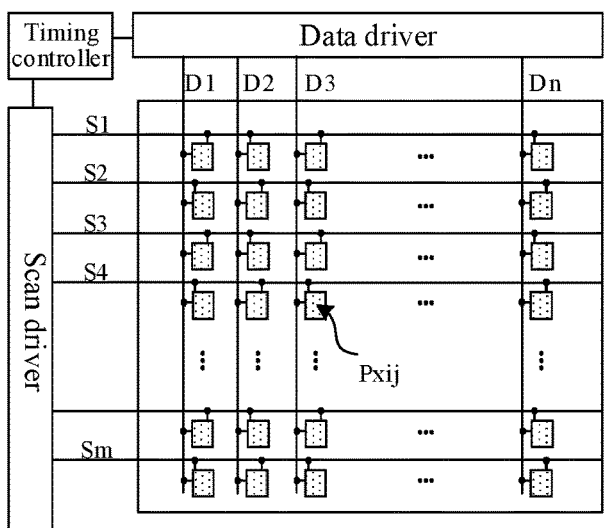
FIG. 1 is a schematic diagram of a structure of a silicon-based OLED display apparatus.

| | | |
|---|---|---|
| 1-pixel drive apparatus; | 2-light leakage control apparatus; | 10-display light emitting device; |
| 20-transition light emitting device; | 22-second transition line; | 23-third transition line; |
| 24-foruth transition line; | 25-fifth transition line; | 26-sixth transition line; |
| 27-seventh transition line; | 30-dummy light emitting device; | 32-second dummy line; |
| 33-third dummy line; | 34-fourth dummy line; | 35-fifth dummy line; |
| 36-sixth dummy line | 37-seventh dummy line; | 40-cathode voltage line; |
| 50-second anode connection line; | 60-third anode connection line; | 100-display region; |
| 101-silicon substrate; | 102-drive circuit layer; | 103-light emitting structure layer; |
| 104-first encapsulation layer; | 105-color film structure layer; | 106-second encapsulation layer; |
| 107-cover plate layer; | 111-first active layer; | 121-second active layer; |
| 131-third active layer; | 112-first gate electrode; | 122-second gate electrode; |
| 132-third gate electrode; | 200-transition region; | 201-twenty-first connection electrode; |
| 202-twenty-second connection electrode; | 203-twenty-third connection electrode; | 204-twenty-fourth connection electrode; |
| 205-twenty-fifth connection electrode; | 206-twenty-sixth connection electrode; | 207-twenty-seventh connection electrode; |
| 208-twenty-eighth connection electrode; | 210-scan signal line | 220-reference signal line; |
| 230-reference connection line; | 300-dummy region; | 301-thiry-first connection electrode; |
| 302-thirty-second connection electrode; | 303-thirty-third connection electrode; | 304-thirty-fourth connection electrode; |
| 305-thirty-fifth connection electrode; | 306-thirty-sixth connection electrode; | 307-thirty-seventy connection electrode; |
| 308-thirty-eighth connection electrode; | 310-data signal line; | 320-second power supply line; |
| 401-fourty-first connection electrode; | 402-fourty-second connection electrode; | 403-fourty-third connection electrode; |
| 410-first power supply line; | 420-third power supply line; | 501-fifty-first connection electrode; |
| 502-fifty-second connection electrode; | 510-first electrode plate; | 601-sixty-first connection electrode; |
| 602-sixty-second connection electrode; | 610-second electrode plate; | 701-seventy-first connection electrode; |
| 702-seventy-second connection electrode; | 710-third electrode plate; | 801-eighty-first connection electrode; |
| 810-anode connection electrode; | 910-first anode; | 920-second anode; |
| 930-third anode. | | |

DETAILED DESCRIPTION

In order to make objects, technical solutions, and advantages of the present disclosure more clear, the embodiments of the present disclosure will be described below in detail in combination with the drawings. It should be noted that implementation modes may be implemented in a plurality of different forms. Those of ordinary skills in the art may easily understand a fact that modes and contents may be transformed into various forms without departing from the purpose and scope of the present disclosure. Therefore, the present disclosure should not be interpreted as being limited to contents recorded in following implementation modes only. The embodiments in the present disclosure and features in the embodiments may be arbitrarily combined with each other without conflict. In order to keep following description of the embodiments of the present disclosure clear and concise, detailed description of a portion of known functions and known components are omitted in the present disclosure. The drawings of the embodiments of the present disclosure relate only to structures involved in the embodiments of the present disclosure, and other structures may be referred to usual designs.

Scales of the drawings in the present disclosure may be used as references in the actual processes, but are not limited thereto. For example, a width-to-length ratio of a channel, a thickness and pitch of each film layer, and a width and pitch of each signal line may be adjusted according to actual needs. A quantity of pixels in a display apparatus and a quantity of sub-pixels in each pixel are not limited to quantities shown in the drawings. The drawings described in the present disclosure are structural schematic diagrams only, and one mode of the present disclosure is not limited to shapes, or numerical values, etc. shown in the drawings.

Ordinal numerals such as "first", "second", "third" and the like in the specification are set in order to avoid confusion of constituent elements, but not to set a limit in quantity.

In the specification, for convenience, wordings such as "middle", "upper", "lower", "front", "back", "vertical", "horizontal", "top", "bottom", "inside", "outside", and the like indicating orientation or positional relationships are used for illustrating positional relationships between constituent elements with reference to the drawings, and are only intended to facilitate description of the specification and simplification of the description, but not to indicate or imply that a referred apparatus or element must have a specific orientation and be constructed and operated in the specific orientation, therefore, they should not be understood as limitations on the present disclosure. The positional relationships between the constituent elements are appropriately changed according to directions of describing various constituent elements. Therefore, wordings used in the specification are not limited and appropriate substitutions may be made according to situations.

Unless otherwise specified and defined explicitly, terms "installation", "mutual connection", and "connection" should be understood in a broad sense in the specification. For example, a connection may be a fixed connection, a detachable connection, or an integrated connection; it may be a mechanical connection or an electrical connection; it may be a direct connection, an indirect connection through an intermediate component, or communication inside two elements. Specific meanings of the above terms in the present disclosure may be understood by a person of ordinary skill in the art according to specific situations.

In the specification, a transistor refers to an element which at least includes three terminals, a gate electrode, a drain electrode, and a source electrode. The transistor has a channel region between the drain electrode (drain electrode terminal, drain region, or drain) and the source electrode (source electrode terminal, source region, or source), and a current may flow through the drain electrode, the channel region, and the source electrode. It should be noted that in the specification, the channel region refers to a region which the current mainly flows through.

In the specification, in order to distinguish between two electrodes of the transistor except the gate electrode, one of the two electrodes is described directly as a first electrode and the other is described directly as a second electrode. Among them, the first electrode may be a drain electrode and the second electrode may be a source electrode, or the first electrode may be a source electrode and the second electrode may be a drain electrode. In a case that a transistor with opposite polarities are used, or in a case that a direction of a current is changed during circuit operation, etc., functions of the "source electrode" and the "drain electrode" are sometimes interchanged. Therefore, the "source electrode" and the "drain electrode" may be interchanged in the specification.

In the specification, an "electrical connection" includes a case where constituent elements are connected together through an element with a certain electrical effect. The "element with the certain electrical effect" is not particularly limited as long as electrical signals may be sent and received between the connected constituent elements. Examples of the "element with the certain electrical action" include not only an electrode and a wiring, but also a switching element such as a transistor, a resistor, an inductor, a capacitor, and another element with one or more functions, etc.

In the specification, "parallel" refers to a state in which an angle formed by two straight lines is greater than −10° and less than 10°, and thus also includes a state in which the angle is greater than −5° and less than 5°. In addition, "vertical" refers to a state in which an angle formed by two straight lines is greater than 80° and less than 100°, and thus also includes a state in which the angle is greater than 85° and less than 95°.

In the specification, a "film" and a "layer" may be interchangeable. For example, sometimes a "conductive layer" may be replaced by a "conductive film". Similarly, sometimes an "insulation film" may be replaced by an "insulation layer".

"Being disposed in a same layer" adopted in the specification means that a structure formed by patterning two (or more than two) structures through a same patterning process, and their materials may be the same or different. For example, materials of forming precursors of multiple types of structures disposed in a same layer are the same, and finally formed materials may be the same or different.

A triangle, rectangle, trapezoid, pentagon, or hexagon, etc. in the specification is not in the strict sense, it may be an approximate triangle, rectangle, trapezoid, pentagon, or hexagon, etc., and there may be some small deformation caused by tolerance, or there may be chamfers, arc edges, and deformation, etc.

"About" in the present disclosure means that a boundary is not defined strictly and numerical values within process and measurement error ranges are allowed.

FIG. 1 is a schematic diagram of a structure of a silicon-based OLED display apparatus. As shown in FIG. 1, the silicon-based OLED display apparatus may include a timing controller, a data signal driver, a scan signal driver, and a pixel array. The pixel array may include a plurality of scan signal lines (S1 to Sm), a plurality of data signal lines (D1 to Dn), and a plurality of sub-pixels Pxij. In an exemplary implementation mode, the timing controller may provide a grayscale value and a control signal suitable for a specification of the data signal driver to the data signal driver, and provide a clock signal, a scan start signal, and etc. suitable for a specification of the scan signal driver to the scan signal driver. The data signal driver may generate a data voltage to be provided to the data signal lines D1, D2, D3, ..., and Dn using the grayscale value and the control signal that are received from the timing controller. For example, the data signal driver may sample the grayscale value using the clock signal and apply a data voltage corresponding to the grayscale value to the data signal lines D1 to Dn by taking a sub-pixel row as a unit, wherein n may be a natural number. The scan signal driver may generate a scan signal to be provided to the scan signal lines S1, S2, S3, ..., and Sm by receiving the clock signal, the scan start signal, and etc. from the timing controller. For example, the scan signal driver may sequentially provide a scan signal with an on-level pulse to the scan signal lines S1 to Sm. For example, the scan signal driver may be constructed in a form of a shift register, and may generate a scan signal in a form of sequentially transmitting a scan start signal provided in a form of an on-level pulse to a next-stage circuit under control of the clock signal, wherein m may be a natural number. A sub-pixel array may include a plurality of sub-pixels PXij. Each sub-pixel PXij may be connected to a corresponding data signal line and a corresponding scan signal line, wherein i and j may be natural numbers. The sub-pixel Pxij may refer to a sub-pixel in which a transistor is connected to both a i-th scan signal line and a j-th data signal line.

Figure 2:
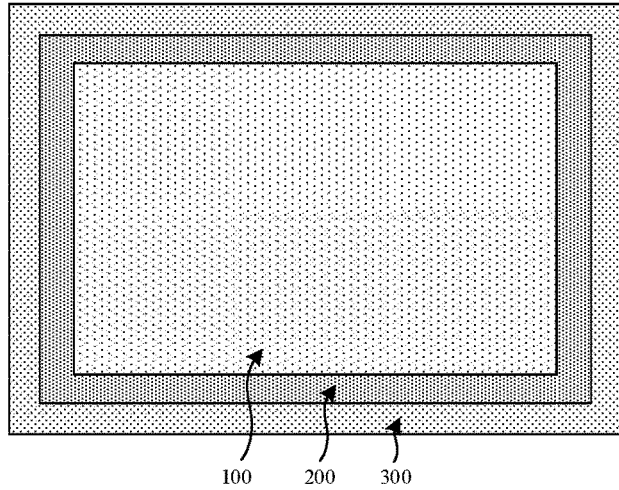
FIG. 2 is a schematic diagram of a planar structure of a silicon-based OLED display apparatus.

FIG. 2 is a schematic diagram of a planar structure of a silicon-based OLED display apparatus. As shown in FIG. 2, on a plane parallel to the silicon-based OLED display apparatus, the silicon-based OLED display apparatus may include a display region 100 and a dummy region 300 located outside the display region 100. In an exemplary implementation mode, the display region 100, which is an Active Area (AA) for image display, may include a plurality of sub-pixels forming a pixel array. A sub-pixel may include a pixel drive circuit and a display light emitting device. The plurality of sub-pixels is configured to display dynamic pictures or static images. In an exemplary implementation mode, the dummy region 300, located at a periphery of the display region 100, may include a plurality of dummy light emitting devices, which are configured to present appearance of display light emitting devices, but do not perform image display.

In an exemplary implementation mode, the silicon-based OLED display apparatus may further include a transition region 200, which may be located between the display region 100 and the dummy region 300, i.e., the transition region 200 is located at the periphery of the display region 100, and the dummy region 300 is located at a periphery of the transition region 200. In an exemplary implementation mode, the transition region 200 may include a plurality of transition light emitting devices, which are configured to present appearance of display light emitting devices, but do not perform image display.

In an exemplary implementation mode, the dummy region 300 may include a corresponding signal line that is configured to transmit a required signal to the display region. The transition region 200 may include a corresponding sensing device that is configured to sense a parameter such as corresponding temperature and brightness, and the present disclosure is not limited thereto.

Figure 3:
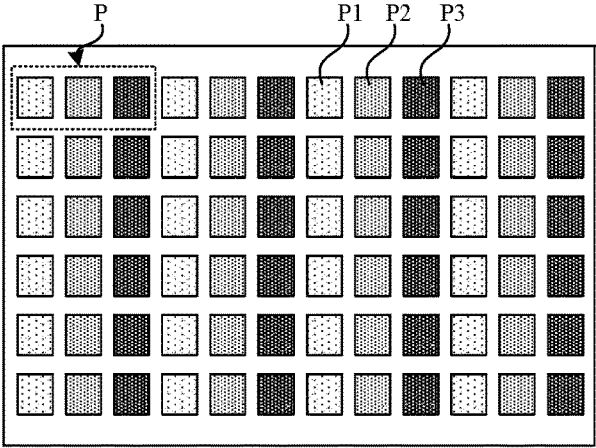
FIG. 3 is a schematic diagram of a planar structure of a display region in a silicon-based OLED display apparatus.

FIG. 3 is a schematic diagram of a planar structure of a display region in a silicon-based OLED display apparatus. As shown in FIG. 3, a display region may include a plurality of pixel units P arranged in a matrix, at least one of the plurality of pixel units P includes a first sub-pixel P1 emitting light of a first color, a second sub-pixel P2 emitting light of a second color, and a third sub-pixel P3 emitting light of a third color. The first sub-pixel P1, the second sub-pixel P2, and the third sub-pixel P3 each include a pixel drive circuit and a light emitting device. A pixel drive circuit in a sub-pixel is connected with a scan signal line and a data signal line, respectively. The pixel drive circuit is configured to receive a data voltage transmitted by the data signal line under control of the scan signal line, and output a corresponding current to a display light emitting device. Display light emitting devices in sub-pixels are connected with pixel drive circuits of the sub-pixels where the display light emitting devices are located, and a display light-emitting device is configured to emit light with corresponding brightness in response to a current output by a pixel drive circuit of a sub-pixel where the display light-emitting device is located.

In an exemplary implementation mode, the first sub-pixel P1 may be a red (R) sub-pixel emitting red light, the second sub-pixel P2 may be a blue (B) sub-pixel emitting blue light, and the third sub-pixel P3 may be a green (G) sub-pixel emitting green light. In an exemplary implementation mode, a sub-pixel may be in a shape of any one or more of a triangle, a square, a rectangle, a rhombus, a trapezoid, a parallelogram, a pentagon, a hexagon, and another polygon, and may be arranged side by side horizontally, side by side vertically, in a shape of X, in a shape of a cross, in a shape of a Chinese character "品", in a shape of a square, in a shape of a diamond, or in a shape of a delta, etc., and the present disclosure is not limited thereto.

In an exemplary implementation mode, a pixel unit may include four sub-pixels, and the present disclosure is not limited thereto.

Figure 4:
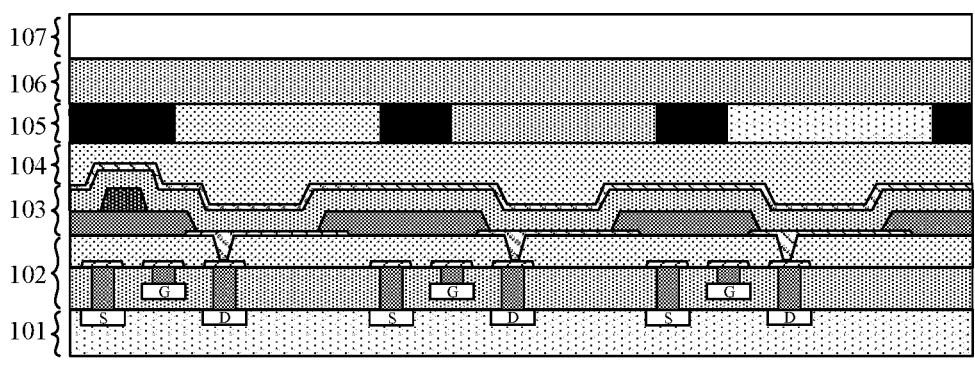
FIG. 4 is a schematic diagram of a sectional structure of a display region in a silicon-based OLED display apparatus.

FIG. 4 is a schematic diagram of a planar structure of a display region in a silicon-based OLED display apparatus, which illustrates a structure in which full color is implemented in a manner of white light+color film. As shown in FIG. 3, the silicon-based OLED display apparatus may include a silicon substrate 101, a drive circuit layer 102 disposed on the silicon substrate 101, a light emitting structure layer 103 disposed on one side of the drive circuit layer 102 away from the silicon substrate 101, a first encapsulation layer 104 disposed on one side of the light emitting structure layer 103 away from the silicon substrate 101, a color film structure layer 105 disposed on one side of the first encapsulation layer 104 away from the silicon substrate 101, a second encapsulation layer 106 disposed on one side of the color film structure layer 105 away from the silicon substrate 101, and a cover plate layer 107 disposed on one side of the second encapsulation layer 106 away from the silicon substrate 101. In some possible implementation modes, the silicon-based OLED display apparatus may include another film layer, and the present disclosure is not limited thereto.

In an exemplary implementation mode, the silicon substrate 101 may be a bulk silicon substrate or a Silicon-On-Insulator (SOI) substrate. The drive circuit layer 102 may be prepared on the silicon substrate 101 through a silicon semiconductor process (e.g., a CMOS process). The drive circuit layer 102 may include a plurality of circuit units, a circuit unit may at least include a pixel drive circuit, and the pixel drive circuit is connected with a scan signal line and a data signal line, respectively. The pixel drive circuit may include a plurality of transistor and a storage capacitor. Only one transistor is taken as an example in FIG. 4. The transistor may include a control electrode G, a first electrode S, and a second electrode D. The control electrode G, the first electrode S, and the second electrode D may be respectively electrically connected with corresponding connection electrodes through vias filled with wolfram metal (i.e., W-vias), and may be connected with another electrical structure (e.g., a trace) through the connection electrodes.

In an exemplary implementation mode, the light emitting structure layer 103 may include a plurality of light emitting devices, each of which may at least include an anode, an organic emitting layer, and a cathode. The anode may be connected with the second electrode D of the transistor through a connection electrode, the organic emitting layer is connected with the anode, the cathode is connected with the organic emitting layer, and the cathode is connected with a cathode voltage line. The organic emitting layer emits light under drive of the anode and the cathode. In an exemplary implementation mode, the organic emitting layer may include an Emitting Layer (EML) and any one or more of a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation mode, for a light emitting device emitting white light, organic emitting layers of all sub-pixels may be connected together to form a common layer.

In an exemplary implementation mode, the first encapsulation layer 104 and the second encapsulation layer 106 may be encapsulated in a manner of Thin Film Encapsulation (TFE), so as to ensure that external water vapor cannot enter the light emitting structure layer. The cover plate layer 107 may be made of glass, or plastic colorless polyimide having flexible characteristics, etc.

In an exemplary implementation mode, the color film structure layer 105 may include a Black Matrix (BM) and a Color Filter (CF). A position of the color filter may correspond to a position of a light emitting device. The black matrix may be located between adjacent color filters, and the color filters are configured to filter white light emitted by light emitting devices into red (R) light, green (G) light, and blue (B) light, to form red sub-pixels, green sub-pixels, and blue sub-pixels.

Figure 5:
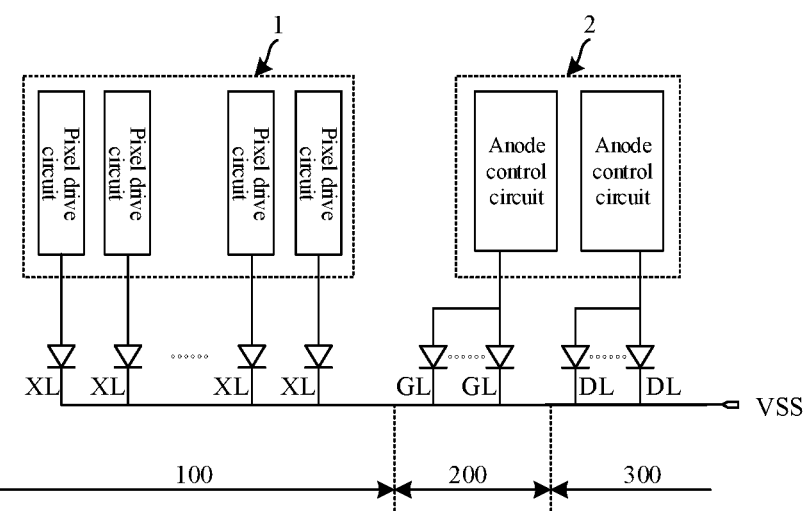
FIG. 5 is a schematic diagram of a structure of a silicon-based OLED display apparatus according to an exemplary embodiment of the present disclosure.

FIG. 5 is a schematic diagram of a structure of a silicon-based OLED display apparatus according to an exemplary embodiment of the present disclosure. As shown in FIG. 5, in an exemplary implementation mode, the display apparatus may include a pixel drive apparatus 1 and a light leakage control apparatus 2. The pixel drive apparatus 1 may include at least one pixel drive circuit configured to receive a data voltage transmitted by a data signal line under control of a scan signal line and output a corresponding current to a display light emitting device XL in the display region 100 to control the display light emitting device XL to emit light. The pixel drive apparatus 2 may include at least one anode control circuit configured to output a corresponding voltage to a transition light emitting device GL in the transition region 200 and/or a dummy light emitting device DL in the dummy region 300 to control the transition light emitting device GL in the transition region 200 and/or the dummy light emitting device DL in the dummy region 300 not to emit light.

In an exemplary implementation mode, the display light emitting device XL located in the display region 100 may include a first anode (display anode), a first emitting layer (display emitting layer), and a first cathode (display cathode). The first anode is connected with an output terminal of the pixel drive circuit, the first cathode is connected with a cathode voltage line VSS, and the first emitting layer is located between the first anode and the first cathode. The display light emitting device XL is configured to emit light under control of the pixel drive circuit.

In an exemplary implementation mode, the transition light emitting device GL located in the transition region 200 may include a second anode (transition anode), a second emitting layer (transition emitting layer), and a second cathode (transition cathode). The second anode is connected with the anode control circuit, the second cathode is connected with a cathode voltage line VSS, and the second emitting layer is located between the second anode and the second cathode. The transition light emitting device GL is configured not to emit light under control of the anode control circuit.

In an exemplary implementation mode, the dummy light emitting device DL located in the dummy region 300 may include a third anode (display cathode), a third emitting layer (dummy emitting layer), and a third cathode (dummy cathode). The third anode is connected with the anode control circuit, the third cathode is connected with a cathode voltage line VSS, and the third emitting layer is located between the third anode and the third cathode. The dummy light emitting device DL is configured not to emit light under control of the anode control circuit.

Figure 6:
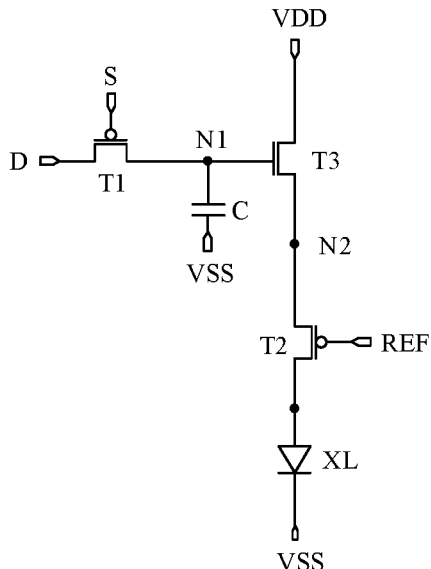
FIG. 6 is an equivalent circuit diagram of a pixel drive circuit.

FIG. 6 is an equivalent circuit diagram of a pixel drive circuit. In an exemplary implementation mode, the pixel drive circuit may be of a structure of 3T1C, 4T1C, 5T1C, 5T2C, 6T1C, or 7T1C. As shown in FIG. 6, the pixel drive circuit may include three transistors (a first transistor T1 to a third transistor T3) and one storage capacitor C. The pixel drive circuit is connected with five signal lines (a scan signal line S, a data signal line D, a reference signal line REF, a first power supply line VDD, and a cathode voltage line VSS). A first node N1 and a second node N2 are meeting points representing related electrical connections in the circuit diagram.

In an exemplary implementation mode, a first terminal of the storage capacitor C is connected with the first node N1, and a second terminal of the storage capacitor C is connected with the cathode voltage line VSS.

In an exemplary implementation mode, a control electrode of the first transistor T1 is connected with the scan signal line S, a first electrode of the first transistor T1 is connected with the data signal line D, and a second electrode of the first transistor T1 is connected with the first node N1.

In an exemplary implementation mode, a control electrode of the second transistor T2 is connected with the reference signal line REF, a first electrode of the second transistor T2 is connected with the second node N2, a second electrode of the second transistor T2 is connected with a first electrode of a display light emitting device XL, and a second electrode of the display light emitting device XL is connected with the cathode voltage line VSS.

In an exemplary implementation mode, a control electrode of the third transistor T3 is connected with the first node N1, a first electrode of the third transistor T3 is connected with the first power supply line VDD, and a second electrode of the third transistor T3 is connected with the second node N2.

In an exemplary implementation mode, a signal of the first power supply line VDD may be a high-level signal continuously provided, a signal of the cathode voltage line VSS may be a low-level signal continuously provided, and a signal of the reference signal line may be a low-level signal continuously provided or may be a variable voltage signal.

In an exemplary implementation mode, the first transistor T1 is configured to, under control of a signal of the scan signal line S, receive a data voltage transmitted by the data signal line D, store the data voltage into the storage capacitor C, and provide the data voltage to the first control electrode of the third transistor T3. The second transistor T2 is configured to provide a voltage signal of the second node N2 to the first electrode of the display light emitting device XL under control of a signal of the reference signal line REF. The third transistor T3 is configured to provide a signal of the first power supply line VDD to the second node N2 under control of the third transistor T3 to drive the display light emitting device XL to emit light.

In an exemplary implementation mode, the first transistor T1, the second transistor T2, and the third transistor T3 may be P-type transistors. In another exemplary implementation mode, the first transistor T1, the second transistor T2, and the third transistor T3 may be N-type transistors. In yet another exemplary implementation mode, the first transistor T1, the second transistor T2, and the third transistor T3 may include a P-type transistor and an N-type transistor. For example, the first transistor T1 and the second transistor T2 may be P-type Metal Oxide Semiconductor (PMOS) transistors, and the third transistor T3 may be an N-type Metal Oxide Semiconductor (NMOS) transistor. In an exemplary implementation mode, the display light emitting device XL may be an OLED or a Quantum dot Light Emitting Diode (QLED), and the present disclosure is not limited thereto.

In an exemplary implementation mode, a plurality of pixel drive circuits may be disposed in a display region, and auxiliary circuits may be disposed in a transition region and a dummy region at a periphery of the display region. For example, an auxiliary circuit may include a reset sub-circuit, which is connected with a second node N2, a discharge signal line, and an initial signal line. The reset sub-circuit is configured to provide an initial voltage, provided by the initial signal line, to the second node N2 under control of a signal of the discharge signal line.

Figure 7:
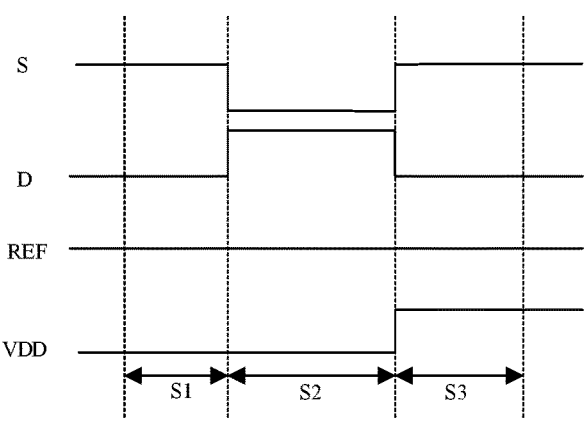
FIG. 7 is a working timing diagram of a pixel drive circuit.

FIG. 7 is a working timing diagram of a pixel drive circuit. An exemplary embodiment of the present disclosure will be described below through a working process of the pixel drive circuit shown in FIG. 6. In the pixel drive circuit shown in FIG. 6, the first transistor T1 and the second transistor T2 are P-type transistors, and the third transistor T3 is an N-type transistor.

In an exemplary implementation mode, the working process of the pixel drive circuit may include following stages.

A first stage S1 is referred to as a reset stage or an initialization stage. In this stage, a signal of the scan signal line S is a high-level signal, a signal of the data signal line D is a low-level signal, a signal of the reference signal line REF is a low-level signal, and a signal of the first power supply line VDD is a low-level signal. The reset sub-circuit provides an initial voltage to the second node N2, and the low-level signal of the reference signal line REF enables the second transistor T2 of P-type to be turned on, so that the initial voltage is provided to the first electrode of the display light emitting device XL through the turned-on second transistor T2 to initialize the display light emitting device XL, so as to rapidly discharge (clear) charges stored in the first electrode of the display light emitting device XL, to ensure that the display light emitting device XL does not emit light, and achieve better dynamic contrast. In this stage, the high-level signal of the scan signal line S enables the first transistor T1 of P-type to be turned off.

A second stage S2 is referred to as a data writing stage. In this stage, a signal of the scan signal line S is a low-level signal, a signal of the data signal line D is a high-level signal, a signal of the reference signal line REF is a low-level signal, and a signal of the first power supply line VDD is a low-level signal. The low-level signal of the scan signal line S enables the first transistor T1 of P-type to be turned on, and a data voltage of the data signal line D is provided to the first node N1 through the turned-on first transistor T1 to charge the storage capacitor C, so that the data voltage output by the data signal line D is stored in the storage capacitor C.

A third stage S3 is referred to as a light emitting stage. In this stage, a signal of the scan signal line S is a high-level signal, a signal of the data signal line D is a low-level signal, a signal of the reference signal line REF is a low-level signal, and a signal of the first power supply line VDD is a high-level signal. The high-level signal of the scan signal line S enables the first transistor T1 of P-type to be turned off, and a data voltage stored in the storage capacitor C is provided to the first node N1, a potential of the first node N1 is the data voltage of the data signal line D, so that the third transistor T3 of N-type is turned on. The low-level signal of the reference signal line REF enables the second transistor T2 of P-type to be turned on, so that the high-level signal output by the first power supply line VDD is provided to the first electrode of the display light emitting device XL through the turned-on third transistor T3 and second transistor T2, to enable the display light emitting device XL to emit light.

In an exemplary implementation mode, in a drive process of the pixel drive circuit, a drive current flowing through the third transistor T3 (referred to as a drive transistor) is determined by a voltage difference between the control electrode and the first electrode of the third transistor T3. The drive current of the third transistor T3 is as follows.

$$I = K^*(Vgs - Vth)^2 = K^*[(Vdd - Vdate) - Vth]^2$$

Herein, I denotes the drive current flowing through the third transistor T3, K denotes a constant, Vgs denotes a voltage difference between a gate electrode and the first electrode of the third transistor T3, Vth denotes a threshold voltage of the third transistor T3, Vdate denotes the data voltage provided by the data signal line D, and Vdd denotes a power supply voltage output by the first power supply line VDD.

In an exemplary implementation mode, the anode control circuit may be a first circuit that provides a cathode voltage VCOM to the second anode of the transition light emitting device GL and/or the third anode of the dummy light emitting device DL, or the anode control circuit may be a second circuit that enables the second anode of the transition light emitting device GL and/or the third anode of the dummy light emitting device DL to be in a floating state.

In an exemplary implementation mode, the first circuit may at least include a cathode voltage line VSS and an anode connection line. A first end of the anode connection line is connected with the cathode voltage line VSS, and a second end of the anode connection line is connected with the second anode of the transition light emitting device GL and/or the third anode of the dummy light emitting device DL. Since both the second anode and the second cathode of the transition light emitting device GL are connected with the cathode voltage line VSS and have a same potential, it may be ensured that the transition light emitting device in the transition region will not emit light. Since both the third anode and the third cathode of the dummy light emitting device DL are connected with the cathode voltage line VSS and have a same potential, it may be ensured that the dummy light emitting device will not emit light.

In an exemplary implementation mode, the second circuit may at least include an anode connection line. A first end of the anode connection line is not connected with any signal line and is in a floating state, and a second end of the anode connection line is connected with the second anode of the transition light emitting device GL and/or the third anode of the dummy light emitting device DL. Since the second cathode of the transition light emitting device GL is connected with the cathode voltage line VSS, while the second anode is connected to a floating potential, and a voltage difference will not be formed between the two, it may be ensured that the transition light emitting device in the transition region will not emit light. Since the third cathode of the dummy light emitting device DL is connected with the cathode voltage line VSS, while the third anode is connected to a floating potential, and a voltage difference will not be formed between the two, it may be ensured that the dummy light emitting device will not emit light.

In an exemplary implementation mode, an anode control circuit connected with the transition light emitting device GL in the transition region 200 may be a first circuit, and an anode control circuit connected with the dummy light emitting device DL in the dummy region 300 may be a first circuit; or an anode control circuit connected with the transition light emitting device GL in the transition region 200 may be a second circuit, and an anode control circuit connected with the dummy light emitting device DL in the dummy region 300 may be a second circuit; or an anode control circuit connected with the transition light emitting device GL in the transition region 200 may be a first circuit, and an anode control circuit connected with the dummy light emitting device DL in the dummy region 300 may be a second circuit; or an anode control circuit connected with the transition light emitting device GL in the transition region 200 may be a second circuit, and an anode control circuit connected with the dummy light emitting device DL in the dummy region 300 may be a first circuit.

Figure 8:
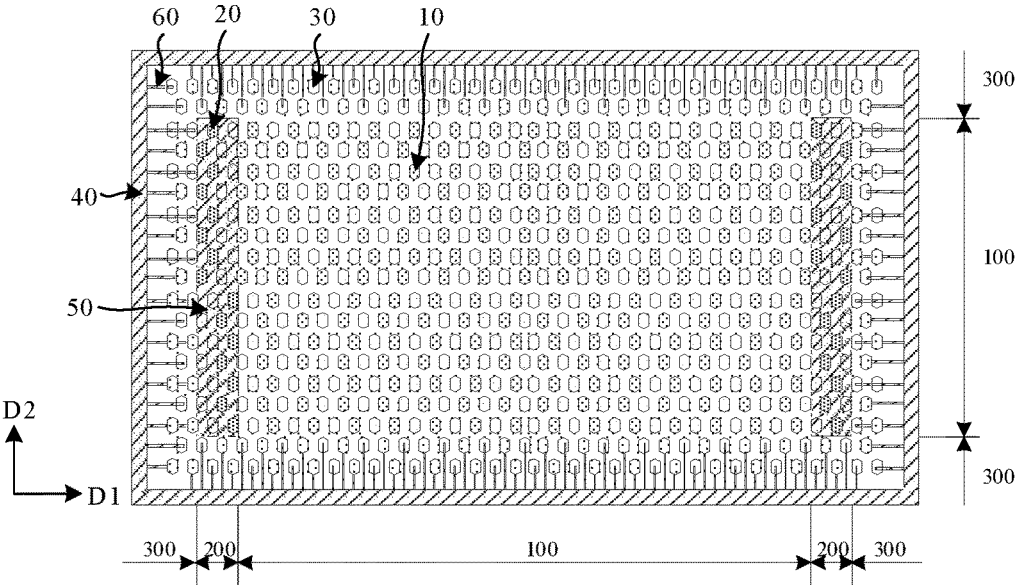
FIG. 8 is a schematic diagram of a structure of another silicon-based OLED display apparatus according to an exemplary embodiment of the present disclosure.

FIG. 8 is a schematic diagram of a structure of another silicon-based OLED display apparatus according to an exemplary embodiment of the present disclosure. As shown in FIG. 8, in an exemplary implementation mode, on a plane parallel to the silicon-based OLED display apparatus, the silicon-based OLED display apparatus may include a display region 100, a dummy region 300 located at a periphery of the display region 100, and a transition region 200 located between the display region 100 and the dummy region 300.

In an exemplary implementation mode, the display region 100 may include a plurality of pixel drive circuits and a plurality of display light emitting devices 10. A display light emitting device 10 may include a first anode (display anode), a first cathode (display cathode), and a first emitting layer (display emitting layer) disposed between the first anode and the first cathode. First cathodes of the plurality of display light emitting devices 10 are connected with a cathode voltage line 40, and first anodes of the plurality of display light emitting devices 10 are correspondingly connected with the plurality of pixel drive circuits.

In an exemplary implementation mode, the transition region 200 may include at least one second anode connection line (i.e., transition anode connection line) 50 and a plurality of transition light emitting devices 20. A transition light emitting device 20 may include a second anode (transition anode), a second cathode (transition cathode), and a second emitting layer (transition emitting layer) disposed between the second anode and the second cathode. Second cathodes of the plurality of transition light emitting devices 20 are connected with a cathode voltage line 40, second anodes of the plurality of transition light emitting devices 20 are connected with a second anode connection line 50. The second anode connection line 50 is configured such that a voltage difference between the second anode and the second cathode is less than a light-up voltage of the transition light emitting device 20.

In an exemplary implementation mode, the dummy region 300 may include the cathode voltage line 40, at least one third anode connection line (i.e., dummy anode connection line) 60, and a plurality of dummy light emitting devices 30. A dummy light emitting device 30 may include a third anode (dummy anode), a third cathode (dummy cathode), and a third emitting layer (dummy emitting layer) disposed between the third anode and the third cathode. Third cathodes of the plurality of dummy light emitting devices 30 are connected with the cathode voltage line 40, and third anodes of the plurality of dummy light emitting devices 30 are connected with the plurality of third anode connection lines 60. A third anode connection line 60 is configured such that a voltage difference between the third anode and the third cathode is less than a light-up voltage of the dummy light emitting device 30.

In an exemplary implementation mode, the cathode voltage line 40 is configured to provide a common voltage (VCOM). The cathode voltage line 40 may be located on one side of the dummy light emitting device 30 away from the display region 100 and may form an annual structure surrounding the dummy light emitting device 30. The cathode voltage line 40 with the annular structure may be called a cathode loop.

In an exemplary implementation mode, a second anode of the transition light emitting device 20 may be connected with the second anode connection line 50 through a transition anode via. A third anode of the dummy light emitting device 30 may be connected with the third anode connection line 60 through a dummy anode via.

In an exemplary implementation mode, as shown in FIG. 8, the second anode connection line 50 may be a monolithic metal layer extending along a column direction (second direction D2). The transition anode connection line 50 may be disposed on both sides of the display region 100 in a row direction (first direction D1). The second anode connection line 50 is connected with the second anode through the transition anode via, but the second anode connection line 50 is not connected with the cathode voltage line 40, and the second anode connection line 50 is not connected with another signal line either, i.e., the second anode connection line 50 is in a floating state. Since the second cathode of the transition light emitting device 20 is connected with the cathode voltage line 40, while the second anode is connected to a floating potential, the second anode connection line 50 may enable a voltage difference between the second anode and the second cathode to be less than a light-up voltage of the transition light emitting device 20, so as to ensure that the transition light emitting device 20 in the transition region will not emit light. The third anode connection line 60 may be in a shape of a strip extending along a first extension direction. The plurality of third anode connection lines 60 may be disposed in sequence along a second extension direction. The first extension direction may be a direction away from the display region, and the second extension direction may be a direction perpendicular to the first extension direction. A first end of the third anode connection line 60 close to the display region is connected with the third anode through the dummy anode via, and a second end of the third anode connection line 60 away from the display region is connected with the cathode voltage line 40. Since both the third anode and the third cathode of the dummy light emitting device 30 are connected with the cathode voltage line 40 and have a same potential, the third anode connection line 60 may enable a voltage difference between the third anode and the third cathode to be less than a light-up voltage of the dummy light emitting device 30, so as to ensure that the dummy light emitting device 30 will not emit light.

In an exemplary implementation mode, for both sides of the first direction D1 of the display apparatus, the first extension direction is a row direction and the second extension direction is a column direction. For both sides of the second direction D2 of the display apparatus, the first extension direction is a column direction, and the second extension direction is a row direction.

In another exemplary implementation mode, as an alternative to the structure shown in FIG. 8, a structure of the second anode connection line 50 is substantially the same as that in FIG. 8. The third anode connection line 60 is connected with the third anode only through the dummy anode via, the third anode connection line 60 is not connected with the cathode voltage line 40, and the third anode connection line 60 is not connected with another signal line either, i.e., the third anode connection line 60 is in a floating state. Since a voltage difference will not be formed between the third anode and the third cathode of the dummy light emitting device 30, the third anode connection line 60 may enable a voltage difference between the third anode and the third cathode to be less than a light-up voltage of the dummy light emitting device 30, which may also ensure that the dummy light emitting device 30 will not emit light.

In yet another exemplary implementation mode, as an alternative to the structure shown in FIG. 8, a structure of the third anode connection line 60 is substantially the same as that in FIG. 8. The second anode connection line 50 is not only connected with the second anode through the transition anode via, but also connected with the cathode voltage line 40 through a corresponding connection line, so that both the second anode and the second cathode of the transition light emitting device 20 are connected with the cathode voltage line 40 and have a same potential, thus the second anode connection line 50 may enable a voltage difference between the second anode and the second cathode to be less than a light-up voltage of the transition light emitting device 20, which may also ensure that the transition light emitting device 20 will not emit light.

In still another exemplary implementation mode, as an alternative to the structure shown in FIG. 8, the second anode connection line 50 is connected with the second anode through a via on one hand, and connected with the cathode voltage line 40 on the other hand, but the third anode connection line 60 is only connected with the third anode through a via, and is not connected with the cathode voltage line 40, and is not connected with another signal line either, i.e., the third anode connection line 60 is in a floating state. Since both the second anode and the second cathode of the transition light emitting device 20 are connected with the cathode voltage line 40 and have a same potential, the second anode connection line 50 may enable a voltage difference between the second anode and the second cathode to be less than a light-up voltage of the transition light emitting device 20, which may ensure that the transition light emitting device 20 will not emit light. Since the third cathode of the dummy light emitting device 30 is connected with the cathode voltage line 40, while the third anode is connected to a floating potential, a voltage difference will not be formed between the two, the third anode connection line 60 may enable a voltage difference between the third anode and the third cathode to be less than alight-up voltage of the dummy light emitting device 30, which may ensure that the dummy light emitting device 30 will not emit light.

In an exemplary implementation mode, shapes of the second anode connection line 50 and the third anode connection line 60, and modes in which the second anode connection line 50 and the third anode connection line 60 are connected with the cathode voltage line 40, etc. may be adjusted correspondingly according to actual needs, and the present disclosure is not limited thereto.

In an exemplary implementation mode, on a plane perpendicular to the display apparatus, the display apparatus may include a silicon substrate, a drive circuit layer disposed on the silicon substrate, and a light emitting structure layer disposed on one side of the drive circuit layer away from the silicon substrate. The light emitting structure layer in the display region 100 may include a plurality of display light emitting devices 10, the light emitting structure layer in the transition region 200 may include a plurality of transition light emitting devices 20, the light emitting structure layer in the dummy region 300 may include a plurality of dummy light emitting devices 30.

In an exemplary implementation mode, a first anode of a display light emitting device 10, a second anode of a transition light emitting device 20, and a third anode of a dummy light emitting device 30 may be disposed in a same layer and formed simultaneously through a same patterning process.

In an exemplary implementation mode, a first emitting layer of the display light emitting device 10, a second emitting layer of the transition light emitting device 20, and a third emitting layer of the dummy light emitting device 30 may be disposed in a same layer and formed simultaneously through a same evaporation process.

In an exemplary implementation mode, a first cathode of the display light emitting device 10, a second cathode of the transition light emitting device 20, and a third cathode of the dummy light emitting device 30 may be disposed in a same layer and connected with each other to form an integrated structure.

In an exemplary implementation mode, the drive circuit layer may include a first conductive layer, a second conductive layer, a third conductive layer, a fourth conductive layer, a fifth conductive layer, a sixth conductive layer, a seventh conductive layer, and an eighth conductive layer that are disposed in sequence on the silicon substrate. The cathode voltage line 40 may be disposed in the eighth conductive layer.

In an exemplary implementation mode, the second anode connection line 50 in the transition region 200, the third anode connection line in the dummy region 300, and the cathode voltage line 40 may be disposed in a same layer and formed simultaneously through a same patterning process.

Figure 9:
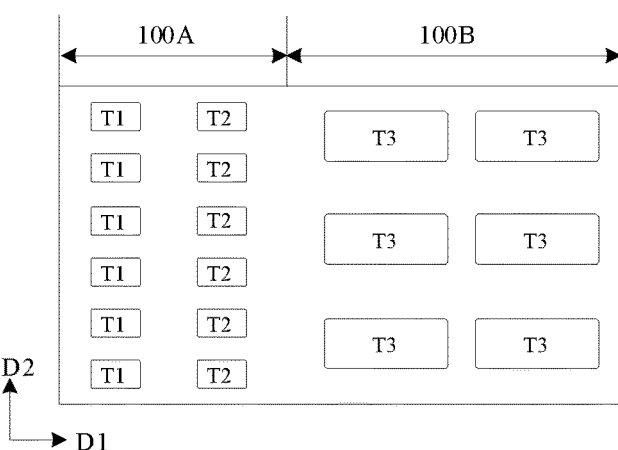
FIG. 9 is a schematic diagram of a planar structure of a drive circuit layer according to an exemplary embodiment of the present disclosure.

FIG. 9 is a schematic diagram of a planar structure of a drive circuit layer according to an exemplary embodiment of the present disclosure. In an exemplary implementation mode, the drive circuit layer in the display region 100 may include a plurality of repetitive units arranged regularly. A repetitive unit may include a plurality of pixel drive circuits. FIG. 9 illustrates a planar structure of one repetitive unit. In an exemplary implementation mode, a pixel drive circuit may include a first transistor T1, a second transistor T2, a third transistor T3, and a storage capacitor. As shown in FIG. 9, the repetitive unit may include a first circuit region 100A and a second circuit region 100B disposed in sequence along a first direction D1. The first circuit region 100A is configured to be provided with a first transistor T1 of P-type and a second transistor T2 of P-type, and the second circuit region 100B is configured to be provided with a third transistor T3 of N-type.

In an exemplary implementation mode, a column of first transistors and a column of second transistors may be disposed in the first circuit region 100A, and an array of third transistors may be disposed in the second circuit region 100B. The column of second transistors may be disposed on one side of the column of first transistors, and the array of third transistors may be disposed on one side of the column of second transistors away from the column of first transistors. The column of first transistors may include six first transistors T1 disposed in sequence along a second direction D2, the column of second transistors may include six second transistors T2 disposed in sequence along the second direction D2, and the array of third transistors may include three rows of transistors disposed in sequence along the second direction D2. Each row of transistors may include two third transistors T3 disposed in sequence along the first direction D1, to form a repetitive unit including six pixel drive circuits. In the present disclosure, transistors of a same type are disposed in a same region, transistors with relatively small sizes are arranged in a column, and transistors with relatively large sizes are arranged in an array, an occupied area of a pixel drive circuit may be reduced, thereby facilitating implementation of higher PPI and better display quality.

In an exemplary implementation mode, a manner in which pixel drive circuits in a repetitive unit are arranged is not limited to an arrangement manner shown in FIG. 9, another suitable arrangement manner may be used according to actual needs, and the present disclosure is not limited thereto.

In an exemplary implementation mode, in at least one pixel drive circuit, a control electrode of a first transistor T1 is connected with a scan signal line, a first electrode of the first transistor T1 is connected with a data signal line, a control electrode of a second transistor T2 is connected with a reference signal line, a control electrode of a third transistor T3 is connected with a first capacitor plate of a storage capacitor, a second capacitor plate of the storage capacitor is connected with a cathode voltage line, and a first electrode of the third transistor T3 is connected with a first power supply line.

In an exemplary implementation mode, the scan signal line and the reference signal line may be disposed in a second conductive layer, the data signal line may be disposed in a third conductive layer, and the first power supply line may be disposed in a fourth conductive layer.

In an exemplary implementation mode, in one repetitive unit, a first capacitor plate of a storage capacitor of at least one pixel drive circuit is disposed in a fifth conductive layer, and a second capacitor plate of the storage capacitor is disposed in a sixth conductive layer.

In an exemplary implementation mode, in one repetitive unit, a first capacitor plate of a storage capacitor of at least one pixel drive circuit is disposed in a seventh conductive layer, and a second capacitor plate of the storage capacitor is disposed in a sixth conductive layer.

Exemplary explanation will be made below through a preparation process of a display apparatus. A "patterning process" mentioned in the present disclosure includes photoresist coating, mask exposure, development, etching, photoresist stripping, and another treatment for a metal material, an inorganic material, or a transparent conductive material, and includes organic material coating, mask exposure, development, and another treatment for an organic material. Deposition may be any one or more of sputtering, evaporation, and chemical vapor deposition, coating may be any one or more of spray coating, spin coating, and inkjet printing, and etching may be any one or more of dry etching and wet etching, the present disclosure is not limited thereto. A "thin film" refers to a layer of thin film formed from a certain material on a substrate using deposition, coating, or another process. If the "thin film" does not need a patterning process in an entire manufacturing process, the "thin film" may also be called a "layer". If the "thin film" needs a patterning process in the entire manufacturing process, the "thin film" is called a "thin film" before the patterning process and is called a "layer" after the patterning process. The "layer" after the patterning process contains at least one "pattern". "A and B being disposed in a same layer" mentioned in the present disclosure refers to that A and B are formed simultaneously through a same patterning process, and a "thickness" of a film layer is a dimension of the film layer in a direction perpendicular to the display apparatus. In the exemplary embodiment of the present disclosure, "an orthographic projection of B being within a range of an orthographic projection of A" or "an orthographic projection of A containing an orthographic projection of B" refers to that a boundary of the orthographic projection of B falls within a range of a boundary of the orthographic projection of A, or a boundary of the orthographic projection of A is overlapped with a boundary of the orthographic projection of B.

In an exemplary implementation mode, a silicon-based OLED display apparatus may include a display region 100, a transition region 200 located on one side of the display region 100, and a dummy region 300 located on one side of the transition region 200 away from the display region 100.

Taking the display region including one repetitive unit as an example, the preparation process of the display apparatus may include following acts.

(1) A silicon substrate is formed. In an exemplary implementation mode, forming the silicon substrate may include: providing a silicon substrate of a P-type silicon material, such as P-type monocrystalline silicon, and performing N-type doping in a first circuit region 100A in each repetitive unit so that an N-type well region is formed in the first circuit region 100A of each repetitive unit. Thus, the N-type well region in the first circuit region 100A on the silicon substrate may serve as a channel region of a P-type transistor (a first transistor T1 and a second transistor T2), and P-type monocrystalline silicon in a second circuit region 100B on the silicon substrate may serve as a channel region of an N-type transistor (a third transistor T3), to facilitate giving play of advantages such as a high speed of an NMOS device, thereby improving performance of a circuit. In the present disclosure, transistors of a same type may be disposed in a same circuit region by disposing the first circuit region 100A and the second circuit region 100B in one repetitive unit, so that pixel drive circuits may be arranged more compactly on a premise of satisfying a design rule, which facilitates improvement of a resolution of the display apparatus.

In an exemplary implementation mode, the silicon substrate may be made of an N-type silicon material, and the present disclosure is not limited thereto.

Figures 10, 11:
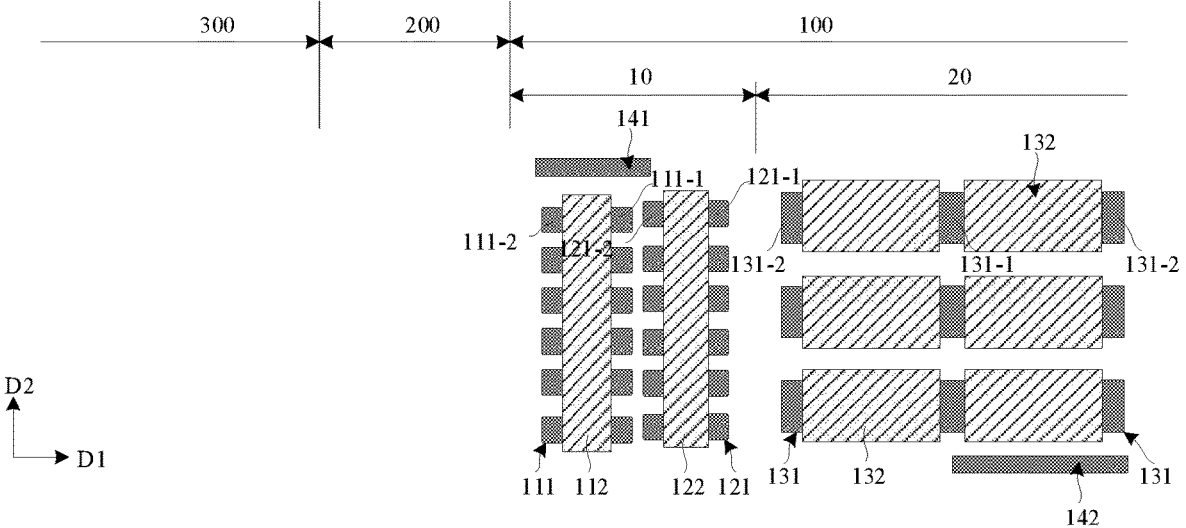
FIG. 10 is a schematic diagram after forming a pattern of a first conductive layer according to an embodiment of the present disclosure.
FIG. 11 is a schematic diagram after forming a pattern of a second insulation layer according to an embodiment of the present disclosure.

(2) A pattern of a first conductive layer is formed. In an exemplary implementation mode, forming the pattern of the first conductive layer may include: depositing a first insulation thin film and a polysilicon thin film in sequence on the silicon substrate, first patterning the polysilicon thin film through a patterning processes to form a first insulation layer overlaying the silicon substrate and a pattern of a polysilicon layer disposed on the first insulation layer, and then performing a doping process by using the pattern of the polysilicon layer as a shield to form a pattern of a first conductive layer and a pattern of an active layer, as shown in FIG. 10.

In an exemplary implementation mode, the doping process may include an N-type doping process and a P-type doping process. The N-type doping process may be aimed at a region where the first circuit region 100A is located, a doping element may be a boron element and etc., and a first gate electrode and a first active layer of the first transistor T1 and a second gate electrode and a second active layer of the second transistor T2 are formed in the first circuit region 100A. The P-type doping process may be aimed at a region where the second circuit region 100B is located, a doping element may be a phosphorus element and etc., and a third gate electrode and a third active layer of the third transistor T3 are formed in the second circuit region 100B.

In an exemplary implementation mode, the doping process may be an ion implantation process in which N-type doping and P-type doping may be performed in sequence. When the N-type doping process is performed in the first circuit region 100A, a region where the N-type doping process is not performed may be shielded by forming a barrier layer. When the P-type doping process is performed in the second circuit region 100B, a region where the P-type doping process is not performed may be shielded by forming a barrier layer.

In an exemplary implementation mode, since the polysilicon layer is made of a semiconductor material, in the ion implantation process, on one hand, the polysilicon layer may be used as a shield, so that ions are implanted into two sides of the polysilicon layer to form first regions and second regions of a plurality of transistors to implement self-alignment; on the other hand, the polysilicon layer may be doped at the same time, so that the polysilicon layer with a higher resistance becomes the first conductive layer with a lower resistance and gate electrodes of the plurality of transistors are formed. In the present disclosure, a polysilicon material is used as the first conductive layer, so that a process cost may be saved and a process difficulty may be reduced.

In an exemplary implementation mode, the pattern of the active layer may at least include a first active layer 111 of the first transistor T1, a second active layer 121 of the second transistor T2, a third active layer 131 of the third transistor T3, a first contact region 141, and a second contact region 142, and the pattern of the first conductive layer may at least include a first gate electrode 112 of the first transistor T1, a second gate electrode 122 of the second transistor T2, and a third gate electrode 132 of the third transistor T3.

In an exemplary implementation mode, the first active layer 111, the first gate electrode 112, the second active layer 121, the second gate electrode 122, and the first contact region 141 may be disposed in the first circuit region 100A, and the third active layer 131, the third gate electrode 132, and the second contact region 142 may be disposed in the second circuit region 100B.

In an exemplary implementation mode, the first gate electrode 112 may be in a shape of a strip extending along a second direction D2 so that gate electrodes of a plurality of first transistors T1 are connected with each other to form an integrated structure. The second gate electrode 122 may be in a shape of a strip extending along the second direction D2 so that gate electrodes of a plurality of second transistors T2 are connected with each other to form an integrated structure. A plurality of third gate electrodes 132 may be in a shape of a rectangle and are disposed separately. In the present disclosure, such arrangement may make arrangement of pixel drive circuits more compact on a premise of satisfying a design rule, which facilitates improvement of a resolution of the display apparatus.

In an exemplary implementation mode, each first active layer 111 may be in a shape of a strip extending along a first direction D1. A plurality of first active layers 111 may be arranged in sequence along the second direction D2, area region where the first gate electrode 112 is overlapped with the first active layer 111 serves as a channel region of the first active layer 111, a first region 111-1 of the first active layer 111 may be located on one side of the channel region in the first direction D1, and a second region 111-2 of the first active layer 111 may be located on one side of the channel region in an opposite direction of the first direction D1.

In an exemplary implementation mode, each second active layer 121 may be in a shape of a strip extending along the first direction D1. A plurality of second active layers 121 may be arranged in sequence along the second direction D2, area region where the second gate electrode 122 is overlapped with the second active layer 121 serves as a channel region of the second active layer 121, a first region 121-1 of the second active layer 121 may be located on one side of the channel region in the first direction D1, and a second region 121-2 of the second active layer 121 may be located on one side of the channel region in the opposite direction of the first direction D1.

In an exemplary implementation mode, each third active layer 131 may be in a shape of a strip extending along the first direction D1. A plurality of third active layers 131 may be arranged in sequence along the second direction D2, area region where the third gate electrode 132 is overlapped with the third active layer 131 serves as a channel region of the third active layer 131, a first region 131-1 and a second region 131-2 of the third active layer 131 may be located on both sides of the channel region.

In an exemplary implementation mode, two adjacent third active layers 131 in the first direction D1 may be connected with each other to form an integrated structure, and first regions 131-1 of the two third active layers 131 may be connected with each other, so as to not only simplify a structure and ensure that first electrodes of two third transistors T3 may receive a same power supply voltage, but also reduce an occupied area of a third transistor T3 and facilitate reduction of an occupied area of a pixel drive circuit, thereby achieving a resolution of a display product.

In an exemplary implementation mode, compared with the first active layer 111 and the second active layer 121, the third active layer 131 has a larger area, a larger width-to-length ratio may be obtained, which facilitates improvement of a drive capability of the third transistor T3, thereby improving a display effect.

In an exemplary implementation mode, the first contact region 141 and the second contact region 142 may be doped regions of different types. In an exemplary implementation mode, the first contact region 141 may be an N-type heavily doped region (N+). The first contact region 141 is configured that high-voltage bias is performed on the silicon substrate of the first circuit region 100A where the first transistor T1 and the second transistor T2 are located, so as to avoid a threshold voltage change enabled by a parasitic effect such as a bias effect of the silicon substrate and improve stability of a circuit. The second contact region 142 may be a P-type heavily doped region (P+). The second contact region 142 is configured that low-voltage bias is performed on the silicon substrate of the second circuit region 100B where the third transistor T3 is located, so as to avoid a threshold voltage change enabled by a parasitic effect such as a bias effect of the silicon substrate and improve stability of a circuit. In the present disclosure, the first contact region 141 is configured that the high-voltage bias is performed on the silicon substrate of the first circuit region 100A, and the second contact region 142 is configured that the low-voltage bias is performed on the silicon substrate of the second circuit region 100B, so that a parasitic PN junction between the two is biased reversely, to isolate devices electrically and reduce a parasitic effect between the devices, thereby improving stability of a circuit.

After this process, the transition region 200 and the dummy region 300 may include the silicon substrate and the first insulation layer disposed on the silicon substrate.

(3) A pattern of a second insulation layer is formed. In an exemplary implementation mode, forming the pattern of the second insulation layer may include: depositing a second insulation thin film on the silicon substrate on which the aforementioned patterns are formed, and patterning the second insulation thin film through a patterning process to form the second insulation layer overlaying the pattern of the first conductive layer. A plurality of vias are disposed on the second insulation layer, as shown in FIG. 11.

In an exemplary implementation mode, the plurality of vias may include a first via V1, a second via V2, a third via V3, a fourth via V4, a fifth via V5, a sixth via V6, a seventh via V7, an eighth via V8, a ninth via V9, a tenth via V10, and an eleventh via V11.

In an exemplary implementation mode, an orthographic projection of the first via V1 on the silicon substrate may be within a range of an orthographic projection of a first region of the first active layer 111 on the silicon substrate. The first insulation layer and the second insulation layer within the first via V1 are etched away to expose a surface of the first region of the first active layer. The first via V1 is configured such that a twenty-first connection electrode formed subsequently (which is used as a first electrode of the first transistor T1) is connected with the first region of the first active layer through this via.

In an exemplary implementation mode, an orthographic projection of the second via V2 on the silicon substrate is within a range of an orthographic projection of a second region of the first active layer on the silicon substrate. The first insulation layer and the second insulation layer within the second via V2 are etched away to expose a surface of the second region of the first active layer. The second via V2 is configured such that a twenty-second connection electrode formed subsequently (which is used as a second electrode of the first transistor T1) is connected with the second region of the first active layer through this via.

In an exemplary implementation mode, an orthographic projection of the third via V3 on the silicon substrate is within a range of an orthographic projection of a first region of the second active layer on the silicon substrate. The first insulation layer and the second insulation layer within the third via V3 are etched away to expose a surface of the first region of the second active layer. The third via V3 is configured such that a twenty-third connection electrode formed subsequently (which is used as both a first electrode of the second transistor T2 and a second electrode of the third transistor T3) is connected with the first region of the second active layer through this via.

In an exemplary implementation mode, an orthographic projection of the fourth via V4 on the silicon substrate is within a range of an orthographic projection of a second region of the second active layer on the silicon substrate. The first insulation layer and the second insulation layer within the fourth via V4 are etched away to expose a surface of the second region of the second active layer. The fourth via V4 is configured such that a twenty-fourth connection electrode formed subsequently (which is used as a second electrode of the second transistor T2) is connected with the second region of the second active layer through this via.

In an exemplary implementation mode, an orthographic projection of the fifth via V5 on the silicon substrate is within a range of an orthographic projection of a first region of the third active layer on the silicon substrate. The first insulation layer and the second insulation layer within the fifth via V5 are etched away to expose a surface of the first region of the third active layer. The fifth via V5 is configured such that a twenty-fifth connection electrode formed subsequently (which is used as a first electrode of the third transistor T3) is connected with the first region of the third active layer through this via. In an exemplary implementation mode, there may be a plurality of fifth vias V5 to reduce a contact resistance and improve connection reliability.

In an exemplary implementation mode, an orthographic projection of the sixth via V6 on the silicon substrate is within a range of an orthographic projection of a second region of the third active layer on the silicon substrate. The first insulation layer and the second insulation layer within the sixth via V6 are etched away to expose a surface of the second region of the third active layer 131. The sixth via V6 is configured such that the twenty-third connection electrode formed subsequently (which is used as both the second electrode of the second transistor T2 and the second electrode of the third transistor T3) is connected with the second region of the third active layer through this via.

In an exemplary implementation mode, an orthographic projection of the seventh via V7 on the silicon substrate is within a range of an orthographic projection of a first gate electrode 112 on the silicon substrate. The second insulation layer within the seventh via V7 is etched away to expose a surface of the first gate electrode 112. The seventh via V7 is configured such that a scan signal line formed subsequently is connected with the first gate electrode 112 through this via. In an exemplary implementation mode, the seventh via V7 may be located on one side of the first gate electrode 112 in an opposite direction of the second direction D2 and may be located between two first active layers.

In an exemplary implementation mode, an orthographic projection of the eighth via V8 on the silicon substrate is within a range of an orthographic projection of a second gate electrode 122 on the silicon substrate. The second insulation layer within the eighth via V8 is etched away to expose a surface of the second gate electrode 122. The eighth via V8 is configured such that a reference signal line formed subsequently is connected with the second gate electrode 122 through this via. In an exemplary implementation mode, the eighth via V8 may be located on one side of the second gate electrode 122 in the second direction D2.

In an exemplary implementation mode, an orthographic projection of the ninth via V9 on the silicon substrate is within a range of an orthographic projection of a third gate electrode 132 on the silicon substrate. The second insulation layer within the ninth via V9 is etched away to expose a surface of the third gate electrode 132. The ninth via V9 is configured such that a twenty-sixth connection electrode formed subsequently is connected with the third gate electrode 132 through this via. In an exemplary implementation mode, the ninth via V9 close to one side of the second transistor T2 may be located on one side of the third gate electrode 132 in an opposite direction of the second direction D2, and the ninth via V9 away from one side of the second transistor T2 may be located on one side of the third gate electrode 132 in the second direction D2. There may be a plurality of ninth vias V9 on each third gate electrode 132 to reduce a contact resistance and improve connection reliability.

In an exemplary implementation mode, an orthographic projection of the tenth via V10 on the silicon substrate is within a range of an orthographic projection of a first contact region 141 on the silicon substrate. The first insulation layer and the second insulation layer within the tenth via V10 are etched away to expose a surface of the first contact region 141. The tenth via V10 is configured such that a twenty-seventh connection electrode formed subsequently is connected with the first contact region 141 through this via. In an exemplary implementation mode, there may be a plurality of tenth vias V10 to reduce a contact resistance and improve connection reliability.

In an exemplary implementation mode, an orthographic projection of the eleventh via V11 on the silicon substrate is within a range of an orthographic projection of a second contact region 142 on the silicon substrate. The first insulation layer and the second insulation layer within the eleventh via V11 are etched away to expose a surface of the second contact region 142. The eleventh via V11 is configured such that a twenty-eighth connection electrode formed subsequently is connected with the second contact region 142 through this via. In an exemplary implementation mode, there may be a plurality of eleventh vias V11 to reduce a contact resistance and improve connection reliability.

After this process, the transition region 200 and the dummy region 300 may include the silicon substrate and the first insulation layer and the second insulation layer stacked on the silicon substrate.

Figure 12A:
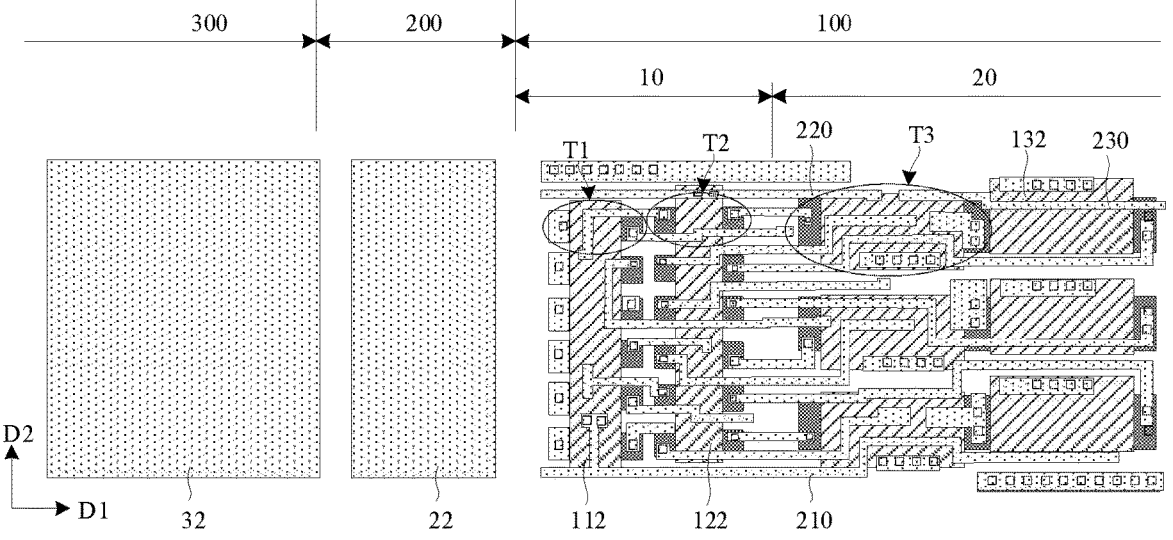
FIGS. 12a and 12b are schematic diagrams after forming a pattern of a second conductive layer according to an embodiment of the present disclosure.
Figure 12B:
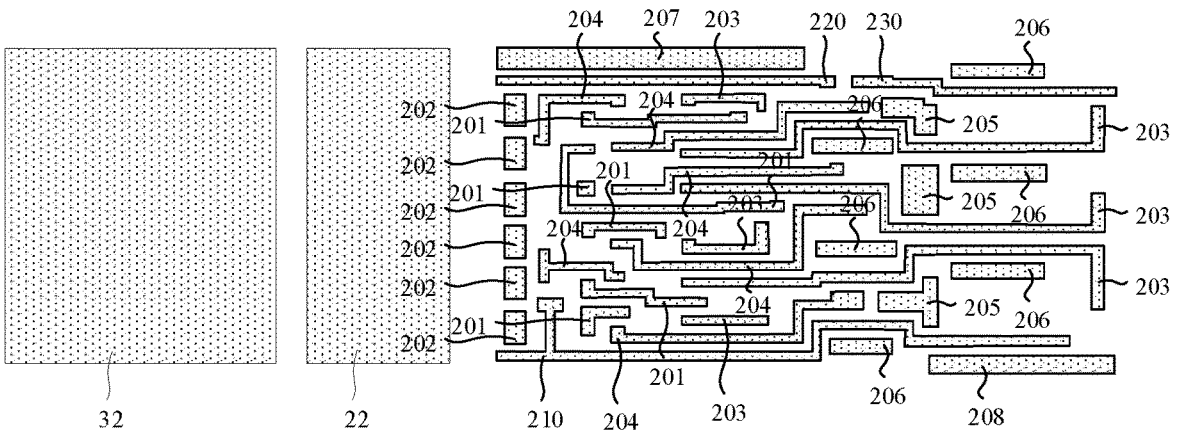

(4) A pattern of a second conductive layer is formed. In an exemplary implementation mode, forming the pattern of the second conductive layer may include: depositing a second conductive thin film on the silicon substrate on which the aforementioned patterns are formed, and patterning the second conductive thin film through a patterning process to form the pattern of the second conductive layer on the second insulation layer, as shown in FIGS. 12a and 12b. FIG. 12b is a schematic diagram of the second conductive layer in FIG. 12a. In an exemplary implementation mode, the second conductive layer may be referred to as a first metal (Metal1) layer.

In an exemplary implementation mode, the pattern of the second conductive layer may at least include: a twenty-first connection electrode 201, a twenty-second connection electrode 202, a twenty-third connection electrode 203, a twenty-fourth connection electrode 204, a twenty-fifth connection electrode 205, a twenty-sixth connection electrode 206, a twenty-seventh connection electrode 207, a twenty-eighth connection electrode 208, a scan signal line 210, a reference signal line 220, a reference connection line 230, a second transition line 22, and a second dummy line 32.

In an exemplary implementation mode, a plurality of twenty-first connection electrodes 201 may be in a shape of a rectangle or may be in a shape of a strip, a main body portion of which extends along the first direction D1. A twenty-first connection electrode 201 may be connected with the first region of the first active layer through the first via V1. The twenty-first connection electrode 201 may serve as the first electrode of the first transistor T1. In the exemplary implementation mode, since the plurality of twenty-first connection electrodes 201 are configured to be connected with data signal lines D formed subsequently, shapes of the plurality of twenty-first connection electrodes 201 are determined according to arrangement of positions of the connected data signal lines D.

In an exemplary implementation mode, a plurality of twenty-second connection electrodes 202 may be in a shape of a rectangle. A twenty-second connection electrode 202 may be connected with the second region of the first active layer through the second via V2. The twenty-second connection electrode 202 may serve as the second electrode of the first transistor T1. In an exemplary implementation mode, shapes of the plurality of twenty-second connection electrodes 202 may be substantially the same.

In an exemplary implementation mode, a plurality of twenty-third connection electrodes 203 may be in a shape of a strip, a main body portion of which extends along the first direction D1. A first end of a twenty-third connection electrode 203 may be connected with the first region of the second active layer through the third via V3, and a second end of the twenty-third connection electrode 203 may be connected with the second region of the corresponding third active layer through the sixth via V6. The twenty-third connection electrode 203 may serve as both the first electrode of the second transistor T2 and the second electrode of the third transistor T3. In an exemplary implementation mode, the plurality of twenty-third connection electrodes 203 are configured to be connected with second electrodes of a plurality of third transistors T3 correspondingly. Since second electrodes of three third transistors T3 are adjacent to the first region of the second active layer and a distance between second electrodes of remaining three third transistors T3 and the first region of the second active layer is relatively long, shapes and lengths of the plurality of twenty-third connection electrodes 203 are determined according to arrangement of positions of the connected third transistors T3.

In an exemplary implementation mode, a plurality of twenty-fourth connection electrodes 204 may be in a shape of a strip, a main body portion of which extends along the first direction D1. A twenty-fourth connection electrode 204 may be connected with the second region of the second active layer through the fourth via V4. The twenty-fourth connection electrode 204 may serve as the second electrode of the second transistor T2. Since the plurality of twenty-fourth connection electrodes 204 are configured to be connected with be connected correspondingly with a plurality of anodes through connection electrodes formed subsequently, shapes of the plurality of twenty-fourth connection electrodes 204 are determined according to arrangement of positions of the plurality of connected anodes.

In an exemplary implementation mode, a plurality of twenty-fifth connection electrodes 205 may be in a shape of a rectangle, a shape of "T", and a shape of "L", respectively. A twenty-fifth connection electrode 205 may be connected with the first region of the third active layer through the fifth via V5. The twenty-fifth connection electrode 205 may serve as the first electrode of the third transistor T3. Since the plurality of twenty-fifth connection electrodes 205 are configured to be connected with a first power supply line VDD through connection electrodes formed subsequently, shapes of the plurality of twenty-fifth connection electrodes 205 are different. In the exemplary implementation mode, first electrodes of two adjacent third transistors T3 in the first direction D1 share one twenty-fifth connection electrode 205, which may simplify a manufacturing process, reduce a production cost, reduce an occupied area of a third transistors T3, and facilitate reduction of an occupied area of a pixel drive circuit, thereby achieving a resolution of a display product.

In an exemplary implementation mode, a plurality of twenty-sixth connection electrodes 206 may be in a shape of a strip, a main body portion of which extends along the first direction D1. A twenty-sixth connection electrode 206 may be connected with the third gate electrode 132 through the ninth via V9. The twenty-sixth connection electrode 206 may be configured to be connected with a thirty-third connection electrode 303 formed subsequently. In an exemplary implementation mode, the plurality of twenty-sixth connection electrodes 206 may have substantially the same shape but different positions.

In an exemplary implementation mode, the twenty-seventh connection electrode 207 may be in a shape of a strip, a main body portion of which extends along the first direction D1. The twenty-seventh connection electrode 207 may be connected with the first contact region 141 through the plurality of tenth vias V10. The twenty-seventh connection electrode 207 is configured to be connected with a third power supply line AVDD through a connection electrode formed subsequently to perform high-voltage bias on a first region, implement electrical isolation of devices, reduce a parasitic effect between the devices, and improve stability of a pixel drive circuit. A signal of the third power supply line AVDD may be a high-level signal continuously provided.

In an exemplary implementation mode, the twenty-eighth connection electrode 208 may be in a shape of a strip, a main body portion of which extends along the first direction D1. The twenty-eighth connection electrode 208 may be connected with the second contact region 142 through the plurality of eleventh vias V11. The twenty-eighth connection electrode 208 is configured to be connected with a second power supply line GND formed subsequently to perform low-voltage bias on a second region, implement electrical isolation of devices, reduce a parasitic effect between the devices, and improve stability of a pixel drive circuit. A signal of the second power supply line GND may be a ground signal continuously provided.

In an exemplary implementation mode, the scan signal line 210 may be in a shape of a strip, a main body portion of which extends along the first direction D1. A scan block is disposed on the scan signal line 210. The scan block may be connected with the first gate electrodes 112 through the seventh via V7, to achieve that the scan signal line 210 provides a scan signal to the gate electrodes of the plurality of first transistors T1. Since the gate electrodes of the plurality of first transistors T1 are controlled through a same scan signal line 210, which facilitates reduction of an occupied area of the scan signal line 210 and reduction of an occupied area of a pixel drive circuit, so that a resolution of a display product is achieved, electrical isolation of devices is achieved, a parasitic effect between the devices is reduced, and stability of the pixel drive circuit is improved.

In an exemplary implementation mode, the reference signal line 220 may be in a shape of a strip, a main body portion of which extends along the first direction D1. The reference signal line 220 may be connected with the second gate electrode 122 through the eighth via V8, to achieve that the reference signal line 220 provides a reference signal to gate electrodes of the plurality of second transistors T2. Since the gate electrodes of the plurality of second transistors T2 are connected with each other to form an integrated structure, one reference signal line 220 may control the gate electrodes of the plurality of second transistors T2 at the same time, which facilitates reduction of an occupied area of the reference signal line 220 and reduction of an occupied area of a pixel drive circuit, thereby achieving a resolution of a display product.

In an exemplary implementation mode, the reference connection line 230 may be in a shape of a strip, a main body portion of which extends along the first direction D1. A first end of the reference connection line 230 may be located on one side of the reference signal line 220 in the first direction D1, and a second end of the reference connection line 230 extends towards its adjacent repetitive unit. The reference connection line 230 is configured to be connected with the reference signal line 220 through a connection electrode subsequently formed, so that the reference signal line 220 may be led out into the adjacent repetitive unit.

In an exemplary implementation mode, the second transition line 22 may be disposed in the transition region 200 and may be in a shape of a strip extending along the second direction D2. The second dummy line 32 may be disposed in the dummy region 300 and may be in a shape of a strip extending along the second direction D2. In an exemplary implementation mode, both the second transition line 22 and the second dummy line 32 may not be connected with a pixel drive circuit and a corresponding signal line in the display region. The second transition line 22 and the second dummy line 32 are disposed in the transition region 200 and the dummy region 300, respectively, which may improve etching uniformity, and improve process quality of preparing a display apparatus.

After this process, the transition region 200 and the dummy region 300 may include the silicon substrate, the first insulation layer and the second insulation layer stacked on the silicon substrate, and the second transition line 22 and the second dummy line 32 disposed on the second insulation layer.

Figure 13:
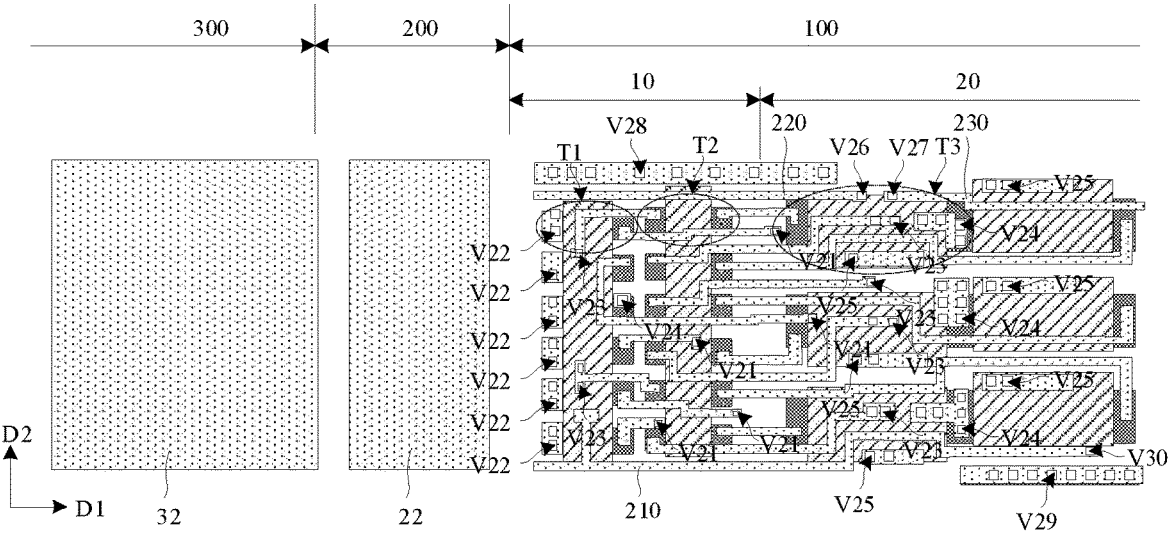
FIG. 13 is a schematic diagram after forming a pattern of a third insulation layer according to an embodiment of the present disclosure.

(5) A pattern of a third insulation layer is formed. In an exemplary implementation mode, forming the pattern of the third insulation layer may include: depositing a third insulation thin film on the silicon substrate, on which the aforementioned patterns are formed, and patterning the third insulation thin film through a patterning process to form the third insulation layer overlaying the pattern of the second conductive layer. A plurality of vias are disposed on the third insulation layer, as shown in FIG. 13.

In an exemplary implementation mode, the plurality of vias may include: a twenty-first via V21, a twenty-second via V22, a twenty-third via V23, a twenty-fourth via V24, a twenty-fifth via V25, a twenty-sixth via V26, a twenty-seventh via V27, a twenty-eighth via V28, a twenty-ninth via V29, and a thirtieth via V30.

In an exemplary implementation mode, an orthographic projection of the twenty-first via V21 on the silicon substrate may be within a range of an orthographic projection of a twenty-first connection electrode 201 on the silicon substrate. The third insulation layer within the twenty-first via V21 is etched away to expose a surface of the twenty-first connection electrode 201. The twenty-first via V21 is configured such that a data signal line D formed subsequently is connected with the twenty-first connection electrode 201 through this via. In an exemplary implementation mode, positions of a plurality of twenty-first vias V21 are determined according to positions of connected data signal lines D and may be located at ends of twenty-first connection electrodes 201 in the first direction D1.

In an exemplary implementation mode, an orthographic projection of the twenty-second via V22 on the silicon substrate may be within a range of an orthographic projection of a twenty-second connection electrode 202 on the silicon substrate. The third insulation layer within the twenty-second via V22 is etched away to expose a surface of the twenty-second connection electrode 202. The twenty-second via V22 is configured to be connected with a thirty-first connection electrode 301 formed subsequently. In an exemplary implementation mode, there may be a plurality of twenty-second vias V22 to reduce a contact resistance and improve connection reliability.

In an exemplary implementation mode, an orthographic projection of the twenty-third via V23 on the silicon substrate may be within a range of an orthographic projection of a twenty-fourth connection electrode 204 on the silicon substrate. The third insulation layer within the twenty-third via V23 is etched away to expose a surface of the twenty-fourth connection electrode 204. The twenty-third via V23 is configured to be connected with a thirty-second connection electrode formed subsequently. In an exemplary implementation mode, a plurality of twenty-third vias V23 may be located at ends of twenty-fourth connection electrodes 204.

In an exemplary implementation mode, an orthographic projection of the twenty-fourth via V24 on the silicon substrate may be within a range of an orthographic projection of a twenty-fifth connection electrode 205 on the silicon substrate. The third insulation layer within the twenty-fourth via V24 is etched away to expose a surface of the twenty-fifth connection electrode 205. The twenty-fourth via V24 is configured to be connected with a thirty-eighth connection electrode formed subsequently. In an exemplary implementation mode, there may be a plurality of twenty-fourth vias V24 to reduce a contact resistance and improve connection reliability.

In an exemplary implementation mode, an orthographic projection of the twenty-fifth via V25 on the silicon substrate may be within a range of an orthographic projection of a twenty-sixth connection electrode 206 on the silicon substrate. The third insulation layer within the twenty-fifth via V25 is etched away to expose a surface of the twenty-sixth connection electrode 206. The twenty-fifth via V25 is configured to be connected with a thirty-third connection electrode formed subsequently. In an exemplary implementation mode, there may be a plurality of twenty-fifth vias V25 to reduce a contact resistance and improve connection reliability.

In an exemplary implementation mode, an orthographic projection of the twenty-sixth via V26 on the silicon substrate may be within a range of an orthographic projection of a reference signal line 220 on the silicon substrate. The third insulation layer within the twenty-sixth via V26 is etched away to expose a surface of the reference signal line 220. The twenty-sixth via V26 is configured to connect the reference signal line 220 with a reference connection line 230 through a thirty-fourth connection electrode formed subsequently. In an exemplary implementation mode, the twenty-sixth via V26 may be located at an end of the reference signal line 220 in the first direction D1.

In an exemplary implementation mode, an orthographic projection of the twenty-seventh via V27 on the silicon substrate may be within a range of an orthographic projection of a reference connection line 230 on the silicon substrate. The third insulation layer within the twenty-seventh via V27 is etched away to expose a surface of the reference connection line 230. The twenty-seventh via V27 is configured to connect the reference connection line 230 with a reference signal line 220 through a thirty-fourth connection electrode subsequently formed. In an exemplary implementation mode, the twenty-seventh via V27 may be located at an end of the reference connection line 230 in an opposite direction of the first direction D1.

In an exemplary implementation mode, an orthographic projection of the twenty-eighth via V28 on the silicon substrate may be within a range of an orthographic projection of a twenty-seventh connection electrode 207 on the silicon substrate. The third insulation layer within the twenty-eighth via V28 is etched away to expose a surface of the twenty-seventh connection electrode 207. The twenty-eighth via V28 is configured to be connected with a thirty-seventh connection electrode subsequently formed. In an exemplary implementation mode, there may be a plurality of twenty-eighth vias V28 to reduce a contact resistance and improve connection reliability.

In an exemplary implementation mode, an orthographic projection of the twenty-ninth via V29 on the silicon substrate may be within a range of an orthographic projection of a twenty-eighth connection electrode 208 on the silicon substrate. The third insulation layer within the twenty-ninth via V29 is etched away to expose a surface of the twenty-eighth connection electrode 208. The twenty-ninth via V29 is configured to be connected with a second power supply line GND formed subsequently to implement low-voltage bias on a second region. In an exemplary implementation mode, there may be a plurality of twenty-ninth vias V29 to reduce a contact resistance and improve connection reliability.

In an exemplary implementation mode, an orthographic projection of the thirtieth via V30 on the silicon substrate may be within a range of an orthographic projection of a scan signal line 210 on the silicon substrate. The third insulation layer within the thirtieth via V30 is etched away to expose a surface of the scan signal line 210. The thirtieth via V30 is configured to be connected with a thirty-fifth connection electrode formed subsequently. In an exemplary implementation mode, the thirtieth via V30 may be located at an end of the scan signal line 210 in the first direction D1.

After this process, the transition region 200 and the dummy region 300 may include the silicon substrate, the first insulation layer and the second insulation layer stacked on the silicon substrate, the second transition line 22 and the second dummy line 32 disposed on the second insulation layer, and the third insulation layer overlaying the second transition line 22 and the second dummy line 32.

Figure 14A:
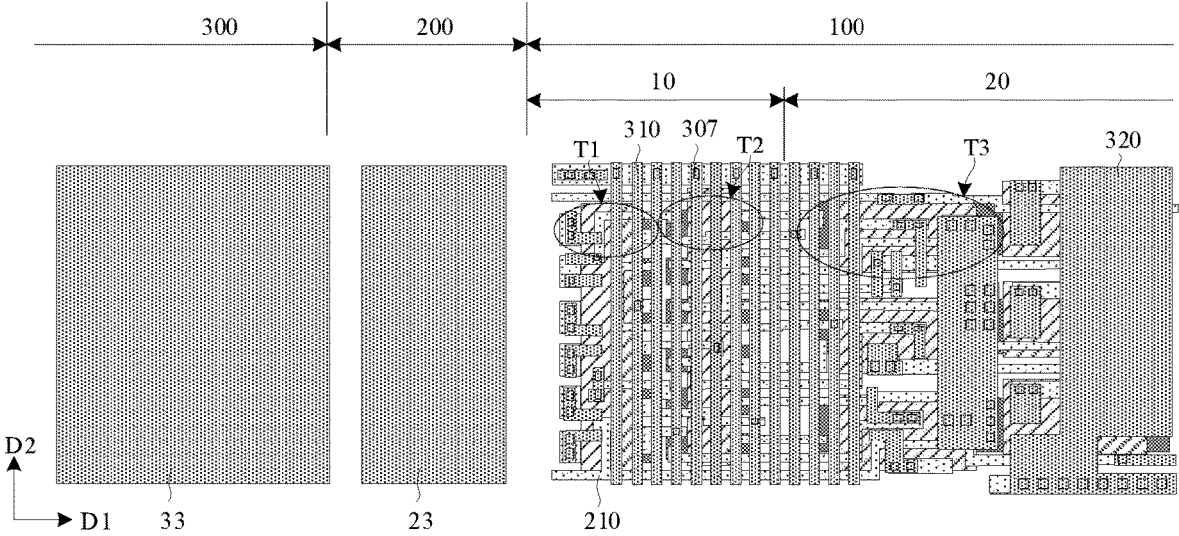
FIGS. 14a and 14b are schematic diagrams after forming a pattern of a third conductive layer according to an embodiment of the present disclosure.
Figure 14B:
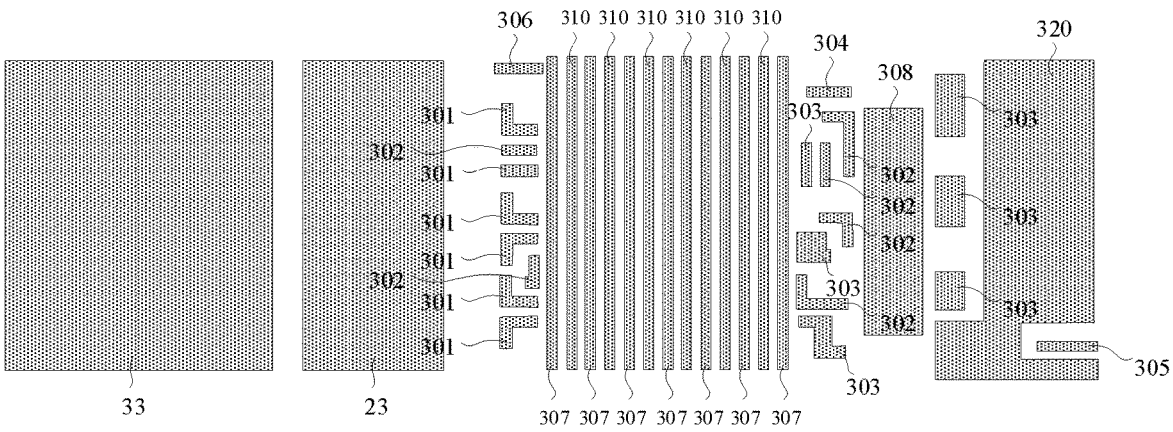

(6) A pattern of a third conductive layer is formed. In an exemplary implementation mode, forming the pattern of the third conductive layer may include: depositing a third conductive thin film on the silicon substrate on which the aforementioned patterns are formed, and patterning the third conductive thin film through a patterning process to form the pattern of the third conductive layer on the third insulation layer, as shown in FIGS. 14a and 14b. FIG. 14b is a schematic diagram of the third conductive layer in FIG. 14a. In an exemplary implementation mode, the third conductive layer may be referred to as a second metal (Metal2) layer.

In an exemplary implementation mode, the pattern of the third conductive layer may at least include: a thirty-first connection electrode 301, a thirty-second connection electrode 302, a thirty-third connection electrode 303, a thirty-fourth connection electrode 304, a thirty-fifth connection electrode 305, a thirty-sixth connection electrode 306, a thirty-seventh connection electrode 307, a thirty-eighth connection electrode 308, a data signal line 310, a second power supply line 320, a third transition line 23, and a third dummy line 33.

In an exemplary implementation mode, a plurality of thirty-first connection electrode 301 may be in a shape of a rectangle or "L". A thirty-first connection electrode 301 may be connected with a twenty-second connection electrode 202 through a twenty-second via V22. The thirty-second connection electrode 301 is configured to be connected with a forty-first connection electrode formed subsequently.

In an exemplary implementation mode, a plurality of thirty-second connection electrode 302 may be in a shape of a rectangle or "L". A thirty-second connection electrode 302 may be connected with a twenty-fourth connection electrode 204 through a twenty-third via V23. The thirty-second connection electrode 302 is configured to be connected with a forty-second connection electrode 402 formed subsequently.

In an exemplary implementation mode, a plurality of thirty-third connection electrode 303 may be in a shape of a rectangle. A thirty-third connection electrode 303 may be connected with a twenty-sixth connection electrode 206 through a twenty-fifth via V25. The thirty-third connection electrode 303 is configured to be connected with a forty-first connection electrode formed subsequently.

In an exemplary implementation mode, the thirty-fourth connection electrode 304 may be in a shape of a strip extending along the first direction D1. A first end of the thirty-fourth connection electrode 304 may be connected with a reference signal line 220 through a twenty-sixth via V26, and a second end of the thirty-fourth connection electrode 304 may be connected with a reference connection line 230 through a twenty-seventh via V27, to implement a connection between the reference signal line 220 and the reference connection line 230.

In an exemplary implementation mode, the thirty-fifth connection electrode 305 may be in a shape of a strip extending along the first direction D1. The thirty-fifth connection electrode 305 may be connected with a scan signal line 210 through a thirtieth via V30. The thirty-fifth connection electrode 305 is configured to be connected with a scan signal line in another repetitive unit adjacent to the first direction D1 to lead out the scan signal line 210 to the another repetitive unit adjacent to the first direction D1.

In an exemplary implementation mode, the thirty-sixth connection electrode 306 may be in a shape of a strip extending along the first direction D1. The thirty-sixth connection electrode 306 may be connected with a twenty-seventh connection electrode 207 through a twenty-eighth via V28.

In an exemplary implementation mode, a plurality of thirty-seventh connection electrodes 307 may be in a shape of a stripe extending along the second direction D2. A thirty-seventh connection electrode 307 may be connected with a twenty-seventh connection electrode 207 through a twenty-eighth via V28. The plurality of thirty-seventh connection electrodes 307 are configured to be connected with a third power supply line AVDD formed subsequently, and at the same time, a high-level voltage signal of the third power supply line AVDD is led out to another repetitive unit adjacent to the second direction D2.

In an exemplary implementation mode, the thirty-eighth connection electrode 308 may be in a shape of a strip, a main body portion of which extends along the second direction D2. The thirty-eighth connection electrode 308 may be connected with a twenty-fifth connection electrode 205 through a plurality of twenty-fourth vias V24. The thirty-eighth connection electrode 308 is configured to be connected with a first power supply line VDD formed subsequently.

In an exemplary implementation mode, a plurality of data signal lines 310 may be in a shape of a strip extending along the second direction D2. A data signal lines 310 may be connected with a twenty-first connection electrode 201 through a twenty-first via V21. Since a plurality of twenty-first connection electrodes 201 are connected with the first region of the first active layer through vias, as the first electrode of the first transistor T1, corresponding connections between the plurality of data signal lines 310 and first electrodes of a plurality of first transistors T1 are implemented, and the data signal line 310 may input a data signal to a corresponding first transistor T1.

In an exemplary implementation mode, the plurality of thirty-seventh connection electrodes 307 and the plurality of data signal lines 310 may be alternately disposed along the first direction D1.

In an exemplary implementation mode, the second power supply line 320 (which may be referred to as a ground line GND) may be in a shape of a strip extending along the second direction D2. The second power supply line 320 may be connected with a twenty-eighth connection electrode 208 through a plurality of twenty-ninth vias V29. In an exemplary implementation mode, since the twenty-eighth connection electrode 208 is connected with a second contact region through a via, a connection between the second power supply line 320 and the second contact region through the twenty-eighth connection electrode 208 is achieved. Low-voltage bias may be performed on a second region by providing a low-level voltage signal through the second power supply line 320, so as to achieve electrical isolation of devices, reduce a parasitic effect between the devices, and improve stability of a pixel drive circuit.

In an exemplary implementation mode, the third transition line 23 may be disposed in the transition region 200 and may be in a shape of a strip extending along the second direction D2. The third dummy line 33 may be disposed in the dummy region 300 and may be in a shape of a strip extending along the second direction D2. In an exemplary implementation mode, both the third transition line 23 and the third dummy line 33 may not be connected with a pixel drive circuit and a corresponding signal line in the display region. The third transition line 23 is disposed in the transition region 200 and the third dummy line 33 is disposed in the dummy region 300, which may improve etching uniformity, and improve process quality of preparing the display apparatus.

After this process, the transition region 200 and the dummy region 300 may include the silicon substrate, the first insulation layer and the second insulation layer stacked on the silicon substrate, the second transition line 22 and the second dummy line 32 disposed on the second insulation layer, the third insulation layer overlaying the second transition line 22 and the second dummy line 32, and the third transition line 23 and the third dummy line 33 disposed on the third insulation layer.

Figure 15:
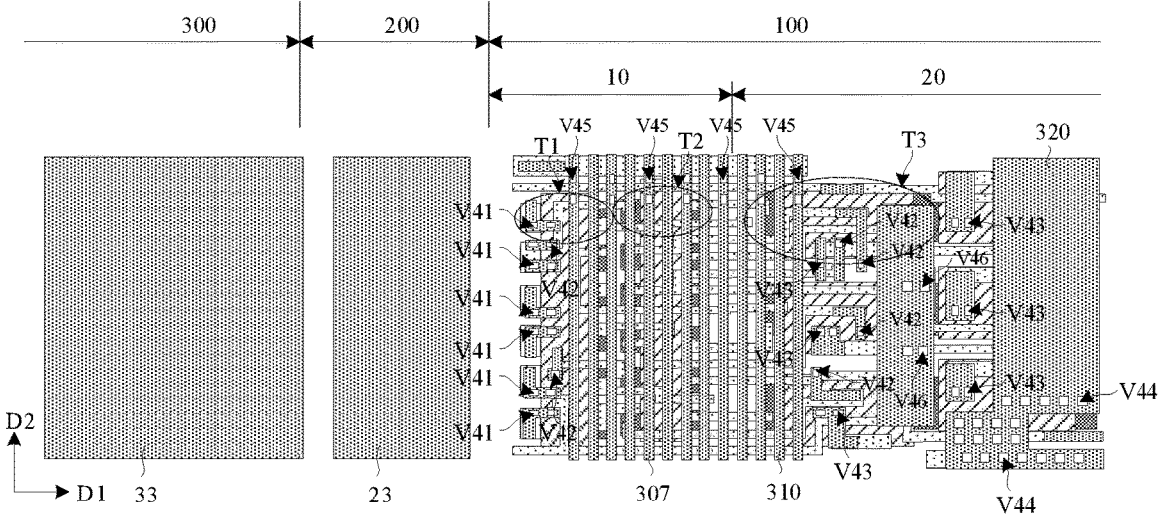
FIG. 15 is a schematic diagram after forming a pattern of a fourth insulation layer according to an embodiment of the present disclosure.

(7) A pattern of a fourth insulation layer is formed. In an exemplary implementation mode, forming the pattern of the fourth insulation layer may include: depositing a fourth insulation thin film on the silicon substrate on which the aforementioned patterns are formed, and patterning the fourth insulation thin film through a patterning process to form the fourth insulation layer overlaying the pattern of the third conductive layer. A plurality of vias are disposed on the fourth insulation layer, as shown in FIG. 15.

In an exemplary implementation mode, the plurality of vias may include: a forty-first via V41, a forty-second via V42, a forty-third via V43, a forty-fourth via V44, a forty-fifth via V45, and a forty-sixth via V46.

In an exemplary implementation mode, an orthographic projection of the forty-first via V41 on the silicon substrate is within a range of an orthographic projection of a thirty-first connection electrode 301 on the silicon substrate. The fourth insulation layer within the forty-first via V41 is etched away to expose a surface of the thirty-first connection electrode 301. The forty-first via V41 is configured to be connected with a forty-first connection electrode formed subsequently.

In an exemplary implementation mode, an orthographic projection of the forty-second via V42 on the silicon substrate is within a range of an orthographic projection of a thirty-second connection electrode 302 on the silicon substrate. The fourth insulation layer within the forty-second via V42 is etched away to expose a surface of the thirty-second connection electrode 302. The forty-second via V42 is configured to be connected with a forty-second connection electrode formed subsequently.

In an exemplary implementation mode, an orthographic projection of the forty-third via V43 on the silicon substrate is within a range of an orthographic projection of a thirty-third connection electrode 303 on the silicon substrate. The fourth insulation layer within the forty-third via V43 is etched away to expose a surface of the thirty-third connection electrode 303. The forty-third via V43 is configured to be connected with a forty-first connection electrode formed subsequently.

In an exemplary implementation mode, orthographic projections of a plurality of forty-fourth vias V44 on the silicon substrate are within a range of an orthographic projection of a second power supply line 320 on the silicon substrate. The fourth insulation layer within the forty-fourth vias V44 is etched away to expose a surface of the second power supply line 320. The forty-fourth vias V44 are configured to be connected with a forty-third connection electrode formed subsequently.

In an exemplary implementation mode, orthographic projection of a plurality of forty-fifth vias V45 on the silicon substrate are within a range of an orthographic projection of a thirty-seventh connection electrode 307 on the silicon substrate. The fourth insulation layer within the forty-seventh vias V47 is etched away to expose a surface of the thirty-seventh connection electrode 307. The forty-fifth vias V45 are configured to be connected with a third power supply line AVDD formed subsequently.

In an exemplary implementation mode, orthographic projections of a plurality of forty-sixth vias V46 on the silicon substrate are within a range of an orthographic projection of a thirty-eighth connection electrode 308 on the silicon substrate. The fourth insulation layer within the forty-sixth vias V46 is etched away to expose a surface of the thirty-eighth connection electrode 308. The forty-sixth vias V46 are configured to be connected with a first power supply line VDD formed subsequently.

After this process, the transition region 200 and the dummy region 300 may include: the silicon substrate, the first insulation layer and the second insulation layer stacked on the silicon substrate, the second transition line 22 and the second dummy line 32 disposed on the second insulation layer, the third insulation layer overlaying the second transition line 22 and the second dummy line 32, the third transition line 23 and the third dummy line 33 disposed on the third insulation layer, and the fourth insulation layer overlaying the third transition line 23 and the third dummy line 33.

Figure 16A:
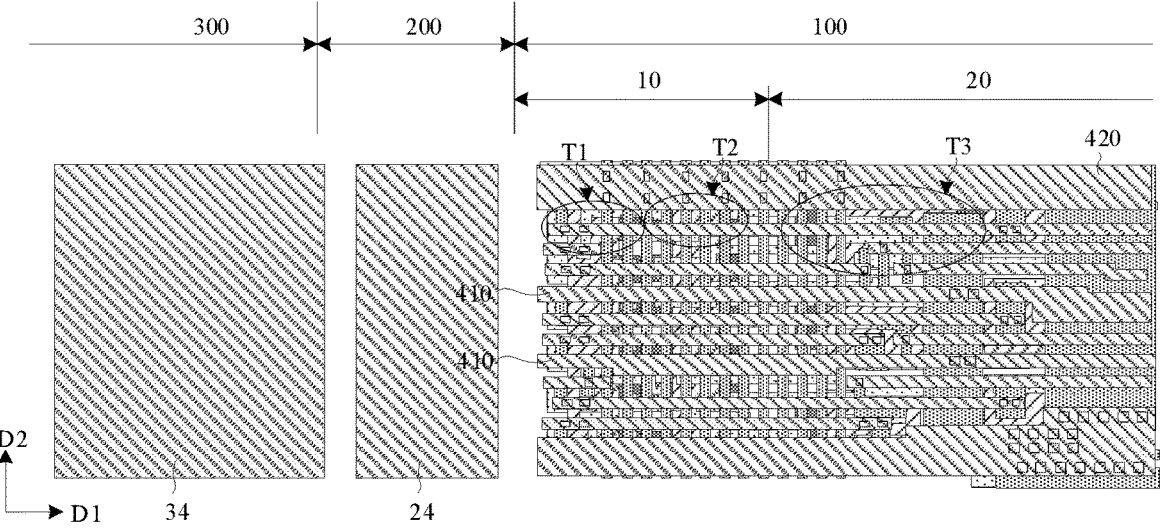
FIGS. 16a and 16b are schematic diagrams after forming a pattern of a fourth conductive layer according to an embodiment of the present disclosure.
Figure 16B:
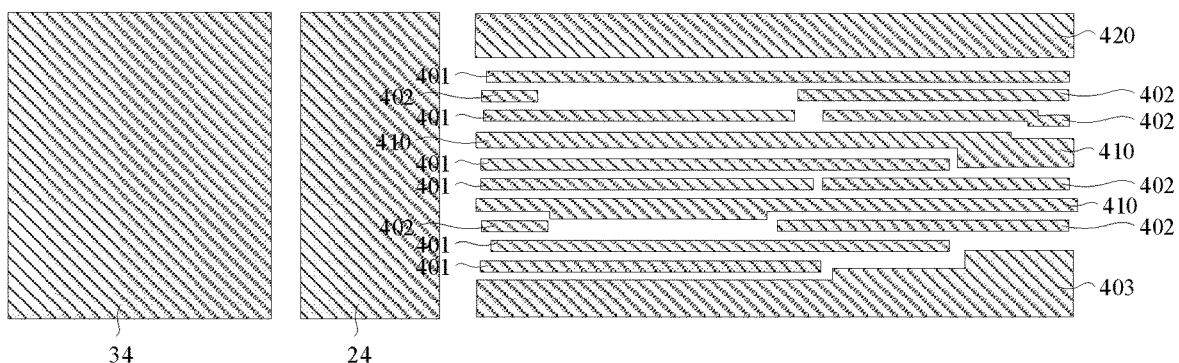

(8) A pattern of a fourth conductive layer is formed. In an exemplary implementation mode, forming the pattern of the fourth conductive layer may include: depositing a fourth conductive thin film on the silicon substrate on which the aforementioned patterns are formed, and patterning the fourth conductive thin film through a patterning process to form the pattern of the fourth conductive layer on the fourth insulation layer, as shown in FIG. 16a and FIG. 16b. FIG. 16b is a schematic diagram of the fourth conductive layer in FIG. 16a. In an exemplary implementation mode, the fourth conductive layer may be referred to as a third metal (Metal3) layer.

In an exemplary implementation mode, the pattern of the fourth conductive layer may at least include: a forty-first connection electrode 401, a forty-second connection electrode 402, a forty-third connection electrode 403, a first power supply line 410, a third power supply line 420, a fourth transition line 24, and a fourth dummy line 34.

In an exemplary implementation mode, the forty-first connection electrode 401 may be in a shape of a strip extending along the first direction D1. A first end of the forty-first connection electrode 401 may be connected with the thirty-first connection electrode 301 through a forty-first via V41, and a second end of the forty-first connection electrode 401 may be connected with the thirty-third connection electrode 303 through a forty-third via V43. Three forty-first connection electrodes 401 are configured to be connected with a first electrode plate formed subsequently, and three forty-first connection electrodes 401 are configured to be connected with a fifty-first connection electrode formed subsequently. Since the thirty-first connection electrode 301 is connected with the twenty-second connection electrode 202 through a via, the twenty-second connection electrode 202 is connected with a second region 111-2 of a first active layer 111 through a via, the thirty-third connection electrode 303 is connected with the twenty-sixth connection electrode 206 through a via, and the twenty-sixth connection electrode 206 is connected with a third gate electrode 132 through a via, a connection between a second electrode of the first transistor T1 and a third gate electrode 132 of the third transistor T3, which have a same potential (first node N1), is achieved.

In an exemplary implementation mode, the fourth-second connection electrode 402 may be in a shape of a rectangle extending along the first direction D1. The forty-second connection electrode 402 may be connected with the thirty-second connection electrode 302 through the forty-second via V42. The forty-second connection electrode 402 is configured to be connected with a fifty-second connection electrode formed subsequently.

In an exemplary implementation mode, the forty-third connection electrode 403 may be in a shape of a strip extending along the first direction D1. The forty-third connection electrode 403 may be connected with the second power supply line 320 through a plurality of forty-fourth vias V44. In an exemplary implementation mode, an orthographic projection of the forty-third connection electrode 403 on the silicon substrate is at least partially overlapped with an orthographic projection of a scan signal line 210 on the silicon substrate. Since the forty-third connection electrode 403 is connected with the second power supply line 320 that provides a low-level voltage signal, the forty-third connection electrode 403 may serve as a shielding electrode to shield a jump signal transmitted by the scan signal line 210, thereby improving stability of a pixel drive circuit.

In an exemplary implementation mode, the first power supply line 410 may be in a shape of a strip extending along the first direction D1. The first power supply line 410 may be connected with the thirty-eighth connection electrode 308 through the forty-sixth via V46. Since the thirty-eighth connection electrode 308 is connected with the twenty-fifth connection electrode 205 through a via, and the twenty-fifth connection electrode 205 is connected with the first region of the third active layer through a via, a connection between the first power supply line 410 and the first electrode of the third transistor T3 is achieved. The first power supply line 410 may provide a power supply voltage to the third transistor T3. In an exemplary implementation mode, two first power supply lines 410 may be disposed in one repetitive unit, and first electrodes of a plurality of third transistors T3 may be connected with the two first power supply lines 410 respectively, to reduce resistances of the first power supply lines 410, thereby improving connection reliability and improving uniformity of a power supply voltage.

In an exemplary implementation mode, the first power supply line 410 may be located between a scan signal line 210 and a reference signal line 220. Since a signal transmitted by the first power supply line 410 is a Direct Current (DC) signal, while signals transmitted by the scan signal line 210 and the reference signal line 220 are jump signals, the first power supply line 410 may effectively shield mutual interference between the reference signal line 220 and the scan signal line 210, thereby improving stability of a circuit.

In an exemplary implementation mode, the third power supply line 420 (which may be referred to as a high voltage line AVDD) may be in a shape of a strip extending along the first direction D1. The third power supply line 420 may be connected with a plurality of thirty-seventh connection electrodes 307 through a plurality of forty-fifth vias V45. Since the plurality of thirty-seventh connection electrodes 307 are connected with a twenty-seventh connection electrode 207 through vias, and the twenty-seventh connection electrode 207 is connected with a first contact region 141 through a via, a connection between the third power supply line 420 and the first contact region 141 through the twenty-seventh connection electrode 207 and the thirty-seventh connection electrodes 307 is achieved. High-voltage bias may be performed on the first region by providing a high-level voltage signal through the third power supply line 420, to achieve electrical isolation of devices, reduce a parasitic effect between the devices, and improve stability of a pixel drive circuit.

In an exemplary implementation mode, an orthographic projection of the third power supply line 420 on the silicon substrate is at least partially overlapped with an orthographic projection of a reference signal line 220 on the silicon substrate. Since a signal transmitted by the third power supply line 420 is a DC signal, while a signal transmitted by the reference signal line 220 is a jump signal, the third power supply line 420 may effectively shield interference of the reference signal line 220 to a pixel drive circuit, so as to improve stability of the pixel drive circuit.

In an exemplary implementation mode, the fourth transition line 24 may be disposed in the transition region 200 and may be in a shape of a strip extending along the second direction D2. The fourth dummy line 34 may be disposed in the dummy region 300 and may be in a shape of a strip extending along the second direction D2. In an exemplary implementation mode, both the fourth transition line 24 and the fourth dummy line 34 may not be connected with a pixel drive circuit and a corresponding signal line in the display region. The fourth transition line 24 is disposed in the transition region 200 and the fourth dummy line 34 is disposed in the dummy region 300, which may improve etching uniformity, and improve process quality of preparing the display apparatus.

After this process, the transition region 200 and the dummy region 300 may include: the silicon substrate, the first insulation layer and the second insulation layer stacked on the silicon substrate, the second transition line 22 and the second dummy line 32 disposed on the second insulation layer, the third insulation layer overlaying the second transition line 22 and the second dummy line 32, the third transition line 23 and the third dummy line 33 disposed on the third insulation layer, the fourth insulation layer overlaying the third transition line 23 and the third dummy line 33, and the fourth transition line 24 and the fourth dummy line 34 disposed on the fourth insulation layer.

Figure 17:
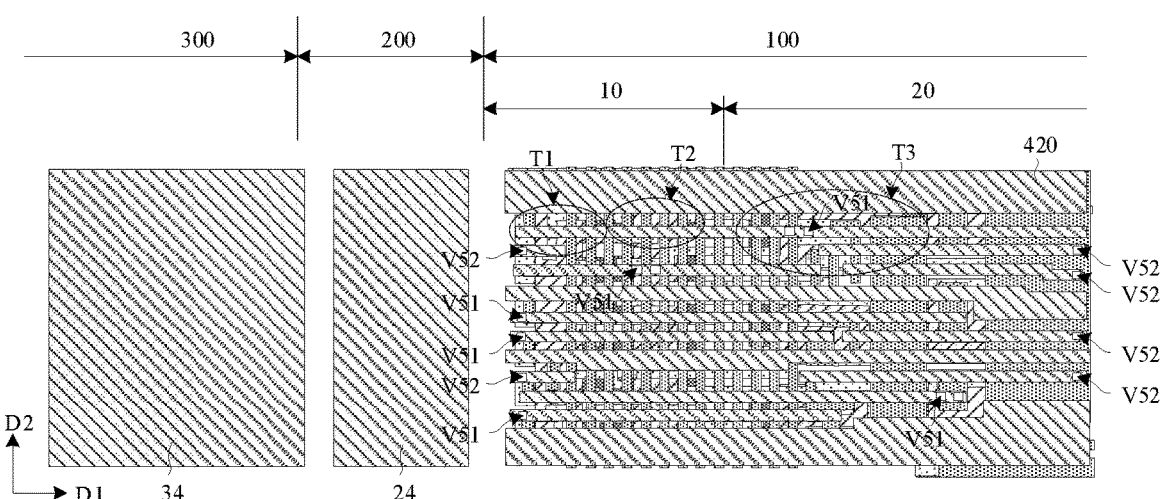
FIG. 17 is a schematic diagram after forming a pattern of a fifth insulation layer according to an embodiment of the present disclosure.

(9) A pattern of a fifth insulation layer is formed. In an exemplary implementation mode, forming the pattern of the fifth insulation layer may include: depositing a fifth insulation thin film on the silicon substrate on which the aforementioned patterns are formed, and patterning the fifth insulation thin film through a patterning process to form the fifth insulation layer overlaying the pattern of the fourth conductive layer. A plurality of vias are disposed on the fifth insulation layer, as shown in FIG. 17.

In an exemplary implementation mode, the plurality of vias may include a fifty-first via V51 and a fifty-second via V52.

In an exemplary implementation mode, an orthographic projection of the fifty-first via V51 on the silicon substrate is within a range of an orthographic projection of the forty-first connection electrode 401 on the silicon substrate. The fifth insulation layer within the fifty-first via V51 is etched away to expose a surface of the forty-first connection electrode 401. Three fifty-first vias V51 are configured to be connected with a first electrode plate formed subsequently and three fifty-first vias V51 are configured to be connected with a fifty-first connection electrode formed subsequently.

In an exemplary implementation mode, an orthographic projection of the fifty-second via V52 on the silicon substrate is within a range of an orthographic projection of the forty-second connection electrode 402 on the silicon substrate. The fifth insulation layer within the fifty-second via V52 is etched away to expose a surface of the forty-second connection electrode 402. The fifty-second via V52 is configured to be connected with a fifty-second connection electrode formed subsequently.

After this process, the transition region 200 and the dummy region 300 may include: the silicon substrate, the first insulation layer and the second insulation layer stacked on the silicon substrate, the second transition line 22 and the second dummy line 32 disposed on the second insulation layer, the third insulation layer overlaying the second transition line 22 and the second dummy line 32, the third transition line 23 and the third dummy line 33 disposed on the third insulation layer, the fourth insulation layer overlaying the third transition line 23 and the third dummy line 33, the fourth transition line 24 and the fourth dummy line 34 disposed on the fourth insulation layer, and the fifth insulation layer overlaying the fourth transition line 24 and the fourth dummy line 34.

Figure 18A:
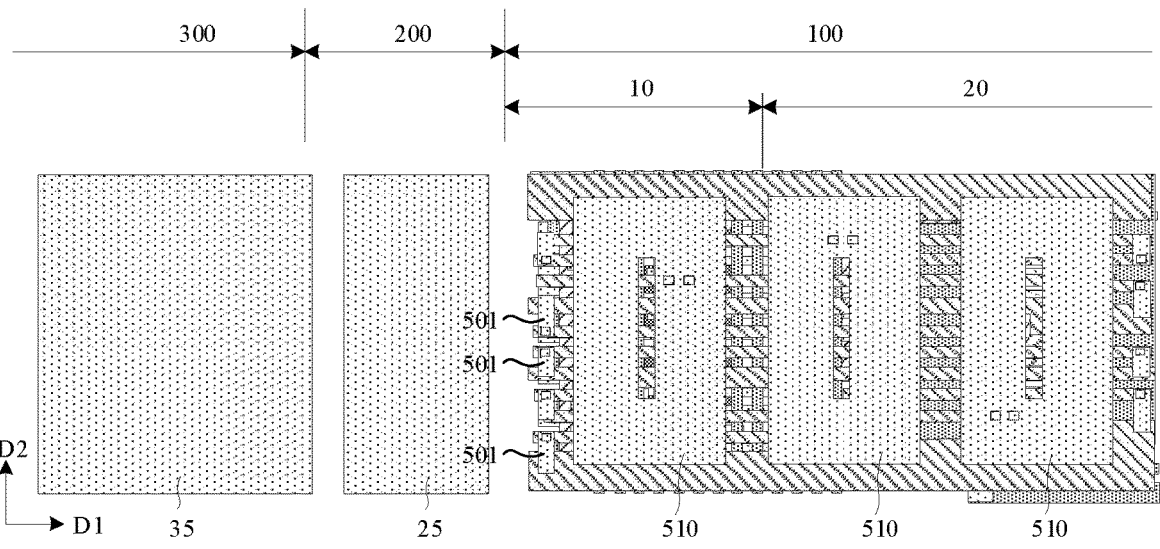
FIGS. 18a and 18b are schematic diagrams after forming a pattern of a fifth conductive layer according to an embodiment of the present disclosure.
Figure 18B:
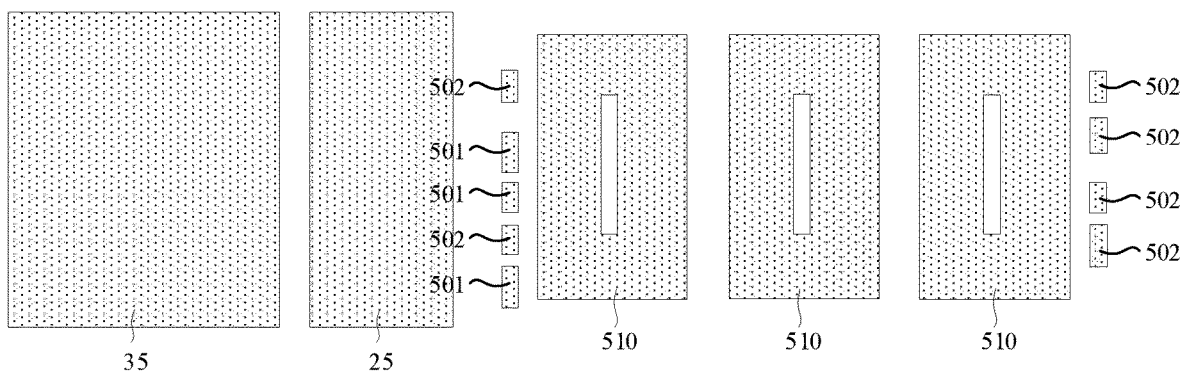

(10) A pattern of a fifth conductive layer is formed. In an exemplary implementation mode, forming the pattern of the fifth conductive layer may include: depositing a fifth conductive thin film on the silicon substrate on which the aforementioned patterns are formed, and patterning the fifth conductive thin film through a patterning process to form the pattern of the fifth conductive layer on the fifth insulation layer, as shown in FIG. 18a and FIG. 18b. FIG. 18b is a schematic diagram of the fifth conductive layer in FIG. 18a. In an exemplary implementation mode, the fifth conductive layer may be referred to as a fourth metal (Metal4) layer.

In an exemplary implementation mode, the pattern of the fifth conductive layer may at least include: a fifty-first connection electrode 501, a fifty-second connection electrode 502, a first electrode plate 510, a fifth transition line 25, and a fifth dummy line 35.

In an exemplary implementation mode, three fifty-first connection electrodes 501 may be in a shape of a rectangle. The three fifty-first connection electrodes 501 may be connected with the forty-first connection electrode 401 through three fifty-first vias V51 respectively. The three fifty-first connection electrodes 501 are configured to be connected with a sixty-first connection electrode formed subsequently.

In an exemplary implementation mode, the fifty-second connection electrode 502 may be in a shape of a rectangle. The fifty-second connection electrode 502 may be connected with the forty-second connection electrode 402 through the fifty-second via V52. The fifty-second connection electrode 502 is configured to be connected with a sixty-second connection electrode formed subsequently.

In an exemplary implementation mode, the first electrode plate 510 may be in a shape of a ring. Three first electrode plates 510 may be connected with the forty-first connection electrode 401 through three fifty-first vias V51, respectively. The first electrode plates 510 are configured to serve as first capacitor plates of three storage capacitors. Since the forty-first connection electrode 401 serves as the first node N1, the first node N1 is connected with the second electrode of the first transistor T1 and the third gate electrode 132 of the third transistor T3, mutual connections between the second electrode of the first transistor T1, the third gate electrode 132 of the third transistor T3, and the first electrode plates 510, which have a same potential, are achieved.

In an exemplary implementation mode, an orthographic projection of at least one first electrode plate 510 on the silicon substrate is at least partially overlapped with an orthographic projection of a first gate electrode 112 on the silicon substrate, an orthographic projection of at least one first electrode plate 510 on the silicon substrate is at least partially overlapped with an orthographic projection of a second gate electrode 122 on the silicon substrate, and an orthographic projection of at least one first electrode plate 510 on the silicon substrate is at least partially overlapped with an orthographic projection of at least one third gate electrode 132 on the silicon substrate.

In an exemplary implementation mode, a size of the first electrode plate 510 may be set according to a capacitance value of a storage capacitor. Since the size of the first electrode plate 510 is relatively large, only three first electrode plates 510 serving as first capacitor plates of storage capacitors are disposed on a fifth conductive layer within one repetitive unit, and the other three third electrode plates serving as first capacitor plates of storage capacitors may be disposed on a seventh conductive layer.

In an exemplary implementation mode, the fifth transition line 25 may be disposed in the transition region 200 and may be in a shape of a strip extending along the second direction D2. The fifth dummy line 35 may be disposed in the dummy region 300 and may be in a shape of a strip extending along the second direction D2. In an exemplary implementation mode, both the fifth transition line 25 and the fifth dummy line 35 may not be connected with a pixel drive circuit and a corresponding signal line in the display region. The fifth transition line 25 is disposed in the transition region 200 and the fifth dummy line 35 is disposed in the dummy region 300, which may improve etching uniformity, and improve process quality of preparing the display apparatus.

After this process, the transition region 200 and the dummy region 300 may include: the silicon substrate, the first insulation layer and the second insulation layer stacked on the silicon substrate, the second transition line 22 and the second dummy line 32 disposed on the second insulation layer, the third insulation layer overlaying the second transition line 22 and the second dummy line 32, the third transition line 23 and the third dummy line 33 disposed on the third insulation layer, the fourth insulation layer overlaying the third transition line 23 and the third dummy line 33, the fourth transition line 24 and the fourth dummy line 34 disposed on the fourth insulation layer, the fifth insulation layer overlaying the fourth transition line 24 and the fourth dummy line 34, and the fifth transition line 25 and the fifth dummy line 35 disposed on the fifth insulation layer.

Figure 19:
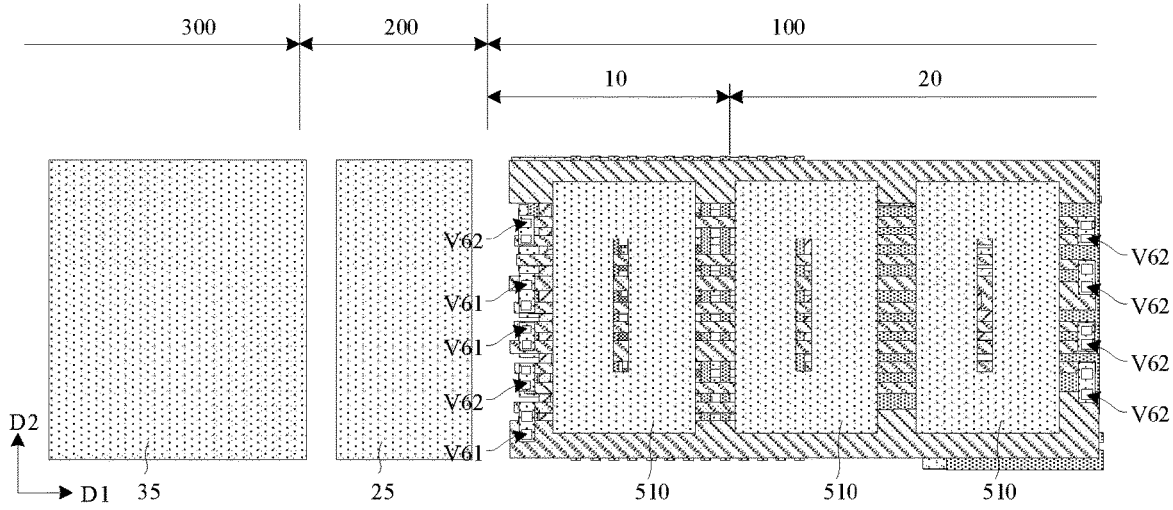
FIG. 19 is a schematic diagram after forming a pattern of a sixth insulation layer according to an embodiment of the present disclosure.

(11) A pattern of the sixth insulation layer is formed. In an exemplary implementation mode, forming the pattern of the sixth insulation layer may include: depositing a sixth insulation thin film on the silicon substrate on which the aforementioned patterns are formed, and patterning the sixth insulation thin film through a patterning process to form the sixth insulation layer overlaying the pattern of the fifth conductive layer. A plurality of vias are disposed on the sixth insulation layer, as shown in FIG. 19.

In an exemplary implementation mode, the plurality of vias may include a sixty-first via V61 and a sixty-second via V62.

In the exemplary implementation mode, an orthographic projection of the sixty-first via V61 on the silicon substrate is within a range of an orthographic projection of the fifty-first connection electrode 501 on the silicon substrate.

The sixth insulation layer within the sixty-first via V61 is etched away to expose a surface of the fifty-first connection electrode 501. The sixty-first via V61 is configured to be connected with a sixty-first connection electrode formed subsequently.

In the exemplary implementation mode, an orthographic projection of the sixty-second via V62 on the silicon substrate is within a range of an orthographic projection of the fifty-second connection electrode 502 on the silicon substrate. The sixth insulation layer within the sixty-second via V62 is etched away to expose a surface of the fifty-second connection electrode 502. The sixty-second via V62 is configured to be connected with a sixty-second connection electrode formed subsequently.

After this process, the transition region 200 and the dummy region 300 may include: the silicon substrate, the first insulation layer and the second insulation layer stacked on the silicon substrate, the second transition line 22 and the second dummy line 32 disposed on the second insulation layer, the third insulation layer overlaying the second transition line 22 and the second dummy line 32, the third transition line 23 and the third dummy line 33 disposed on the third insulation layer, the fourth insulation layer overlaying the third transition line 23 and the third dummy line 33, the fourth transition line 24 and the fourth dummy line 34 disposed on the fourth insulation layer, the fifth insulation layer overlaying the fourth transition line 24 and the fourth dummy line 34, the fifth transition line 25 and the fifth dummy line 35 disposed on the fifth insulation layer, and the sixth insulation layer overlaying the fifth transition line 25 and the fifth dummy line 35.

Figure 20:
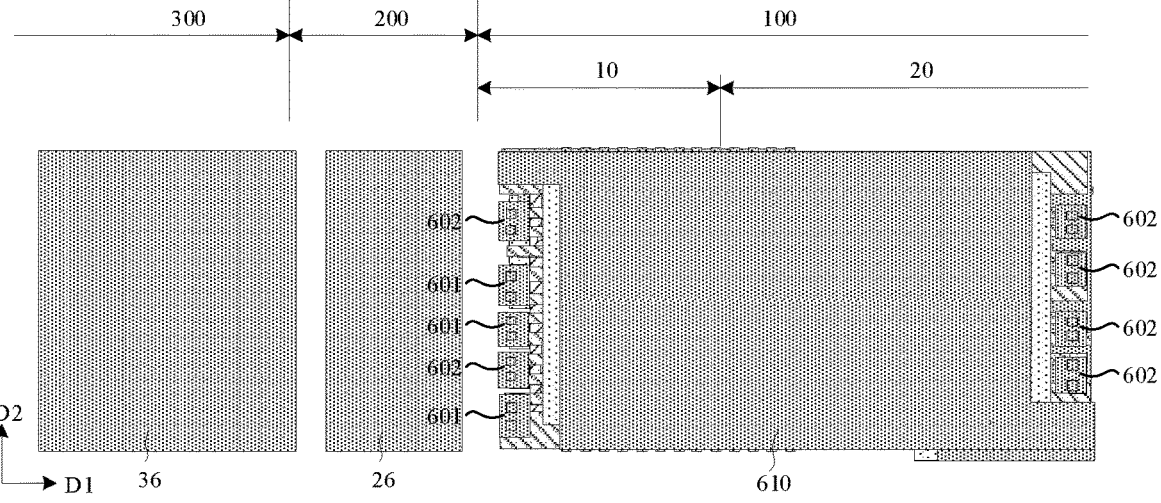
FIG. 20 is a schematic diagram after forming a pattern of a sixth conductive layer according to an embodiment of the present disclosure.

(12) A pattern of a sixth conductive layer is formed. In an exemplary implementation mode, forming the pattern of the sixth conductive layer may include: depositing a sixth conductive thin film on the silicon substrate on which the aforementioned patterns are formed, and patterning the sixth conductive thin film through a patterning process to form the pattern of the sixth conductive layer on the sixth insulation layer, as shown in FIG. 20. In an exemplary implementation mode, the sixth conductive layer may be of a Metal-Insulator-Metal (MIM) structure. The sixth conductive layer may be referred to as a MIM layer.

In an exemplary implementation mode, the pattern of the sixth conductive layer may at least include: a sixty-first connection electrode 601, a sixty-second connection electrode 602, a second electrode plate 610, a sixth transition line 26, and a sixth dummy line 36.

In an exemplary implementation mode, three sixty-first connection electrodes 601 may be in a shape of a rectangle. The sixty-first connection electrodes 601 may be connected with the fifty-first connection electrode 501 through three sixty-first vias V61 respectively. The three sixty-first connection electrodes 601 are configured to be connected with a seventy-first connection electrode formed subsequently.

In an exemplary implementation mode, the sixty-second connection electrode 602 may be in a shape of a rectangle. The sixty-second connection electrode 602 may be connected with the fifty-second connection electrode 502 through the sixty-second via V62. The sixty-second connection electrode 602 is configured to be connected with a seventy-second connection electrode formed subsequently.

In an exemplary implementation mode, the second electrode plate 610 may be in a shape of a rectangle. An orthographic projection of the second electrode plate 610 on the silicon substrate is at least partially overlapped with orthographic projections of three first electrode plates 510 on the silicon substrate. The second electrode plate 610 may be connected with a cathode voltage line VSS subsequently formed through a corresponding connection line. The second electrode plate 610 is configured to serve as a second capacitor plate of a storage capacitor. The three first electrode plates 510 each and the second electrode plate 610 constitute three storage capacitors.

In an exemplary implementation mode, the sixth transition line 26 may be disposed in the transition region 200 and may be in a shape of a strip extending along the second direction D2. The sixth dummy line 36 may be disposed in the dummy region 300 and may be in a shape of a strip extending along the second direction D2. In an exemplary implementation mode, both the sixth transition line 26 and the sixth dummy line 36 may not be connected with a pixel drive circuit and a corresponding signal line in the display region. The sixth transition line 26 is disposed in the transition region 200 and the sixth dummy line 36 is disposed in the dummy region 300, which may improve etching uniformity, and improve process quality of preparing the display apparatus.

After this process, the transition region 200 and the dummy region 300 may include: the silicon substrate, the first insulation layer and the second insulation layer stacked on the silicon substrate, the second transition line 22 and the second dummy line 32 disposed on the second insulation layer, the third insulation layer overlaying the second transition line 22 and the second dummy line 32, the third transition line 23 and the third dummy line 33 disposed on the third insulation layer, the fourth insulation layer overlaying the third transition line 23 and the third dummy line 33, the fourth transition line 24 and the fourth dummy line 34 disposed on the fourth insulation layer, the fifth insulation layer overlaying the fourth transition line 24 and the fourth dummy line 34, the fifth transition line 25 and the fifth dummy line 35 disposed on the fifth insulation layer, the sixth insulation layer overlaying the fifth transition line 25 and the fifth dummy line 35, and the sixth transition line 26 and the sixth dummy line 36 disposed on the sixth insulation layer.

Figure 21:
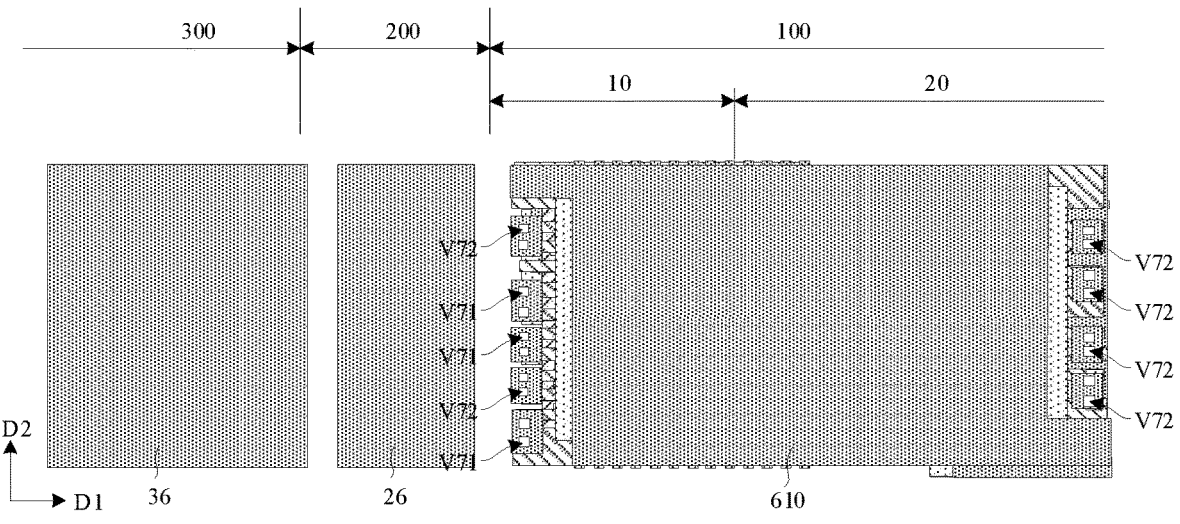
FIG. 21 is a schematic diagram after forming a pattern of a seventh insulation layer according to an embodiment of the present disclosure.

(13) A pattern of a seventh insulation layer is formed. In an exemplary implementation mode, forming the pattern of the seventh insulation layer may include: depositing a seventh insulation thin film on the silicon substrate on which the aforementioned patterns are formed, and patterning the seventh insulation thin film through a patterning process to form the seventh insulation layer overlaying the pattern of the sixth conductive layer. A plurality of vias are disposed on the seventh insulation layer, as shown in FIG. 21.

In an exemplary implementation mode, the plurality of vias may include a seventy-first via V71 and a seventy-second via V72.

In an exemplary implementation mode, an orthographic projection of the seventy-first via V71 on the silicon substrate is within a range of an orthographic projection of the sixty-first connection electrode 601 on the silicon substrate. The seventh insulation layer within the seventy-first via V71 is etched away to expose a surface of the sixty-first connection electrode 601. The seventy-first via V71 is configured to be connected with a seventy-first connection electrode formed subsequently.

In an exemplary implementation mode, an orthographic projection of the seventy-second via V72 on the silicon substrate is within a range of an orthographic projection of the sixty-second connection electrode 602 on the silicon substrate. The seventh insulation layer within the seventy-second via V72 is etched away to expose a surface of the sixty-second connection electrode 602. The seventy-second via V72 is configured to be connected with a seventy-second connection electrode formed subsequently.

After this process, the transition region 200 and the dummy region 300 may include: the silicon substrate, the first insulation layer and the second insulation layer stacked on the silicon substrate, the second transition line 22 and the second dummy line 32 disposed on the second insulation layer, the third insulation layer overlaying the second transition line 22 and the second dummy line 32, the third transition line 23 and the third dummy line 33 disposed on the third insulation layer, the fourth insulation layer overlaying the third transition line 23 and the third dummy line 33, the fourth transition line 24 and the fourth dummy line 34 disposed on the fourth insulation layer, the fifth insulation layer overlaying the fourth transition line 24 and the fourth dummy line 34, the fifth transition line 25 and the fifth dummy line 35 disposed on the fifth insulation layer, the sixth insulation layer overlaying the fifth transition line 25 and the fifth dummy line 35, the sixth transition line 26 and the sixth dummy line 36 disposed on the sixth insulation layer, and the seventh insulation layer overlaying the sixth transition line 26 and the sixth dummy line 36.

Figure 22:
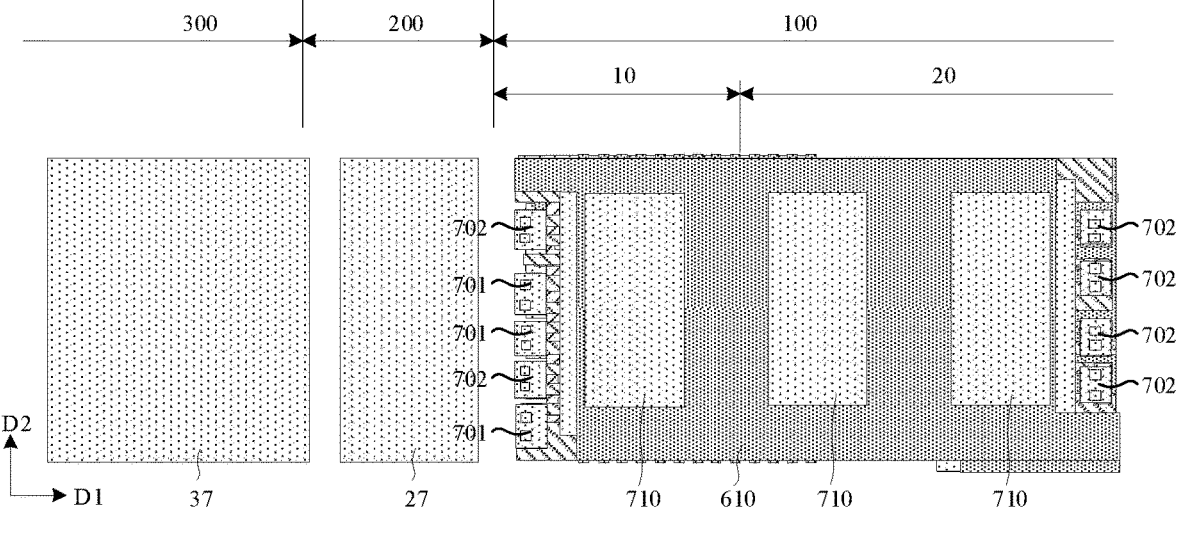
FIG. 22 is a schematic diagram after forming a pattern of a seventh conductive layer according to an embodiment of the present disclosure.

(14) A pattern of a seventh conductive layer is formed. In an exemplary implementation mode, forming the pattern of the seventh conductive layer may include: depositing a seventh conductive thin film on the silicon substrate on which the aforementioned patterns are formed, and patterning the seventh conductive thin film through a patterning process to form the pattern of the seventh conductive layer on the seventh insulation layer, as shown in FIG. 22. In an exemplary implementation mode, the seventh conductive layer may be referred to as a fifth metal (Metal5) layer.

In an exemplary implementation mode, the seventh conductive layer may at least include: a seventy-first connection electrode 701, a seventy-second connection electrode 702, a third electrode plate 710, a seventh transition line 27, and a seventh dummy line 37.

In an exemplary implementation mode, the seventy-first connection electrode 701 may be in a shape of a rectangle. The seventy-first connection electrode 701 may be connected with the sixty-first connection electrode 601 through the seventy-first via V71. The seventy-first connection electrode 701 is configured to be connected with an eighty-first connection electrode formed subsequently.

In an exemplary implementation mode, the seventy-second connection electrode 702 may be in a shape of a rectangle. The seventy-second connection electrode 702 may be connected with the sixty-second connection electrode 602 through the seventy-second via V72. The seventy-second connection electrode 702 is configured to be connected with an anode connection electrode formed subsequently.

In an exemplary implementation mode, the third electrode plate 710 may be in a shape of a rectangle. Orthographic projections of three third electrode plates 710 on the silicon substrate are at least partially overlapped with an orthographic projection of the second electrode plate 610 on the silicon substrate. The three third electrode plates 710 are configured to serve as first capacitor plates of three storage capacitors. The three third electrode plates 710 each and the second electrode plate 610 form three storage capacitors.

In an exemplary implementation mode, the seventh transition line 27 may be disposed in the transition region 200 and may be in a shape of a strip extending along the second direction D2. The seventh dummy line 37 may be disposed in the dummy region 300 and may be in a shape of a strip extending along the second direction D2. In an exemplary implementation mode, both the seventh transition line 27 and the seventh dummy line 37 may not be connected with a pixel drive circuit and a corresponding signal line in the display region. The seventh transition line 27 is disposed in the transition region 200 and the seventh dummy line 37 is disposed in the dummy region 300, which may improve etching uniformity, and improve process quality of preparing the display apparatus.

After this process, the transition region 200 and the dummy region 300 may include: the silicon substrate, the first insulation layer and the second insulation layer stacked on the silicon substrate, the second transition line 22 and the second dummy line 32 disposed on the second insulation layer, the third insulation layer overlaying the second transition line 22 and the second dummy line 32, the third transition line 23 and the third dummy line 33 disposed on the third insulation layer, the fourth insulation layer overlaying the third transition line 23 and the third dummy line 33, the fourth transition line 24 and the fourth dummy line 34 disposed on the fourth insulation layer, the fifth insulation layer overlaying the fourth transition line 24 and the fourth dummy line 34, the fifth transition line 25 and the fifth dummy line 35 disposed on the fifth insulation layer, the sixth insulation layer overlaying the fifth transition line 25 and the fifth dummy line 35, the sixth transition line 26 and the sixth dummy line 36 disposed on the sixth insulation layer, the seventh insulation layer overlaying the sixth transition line 26 and the sixth dummy line 36, and the seventh transition line 27 and the seventh dummy line 37 disposed on the seventh insulation layer.

Figures 23, 24:
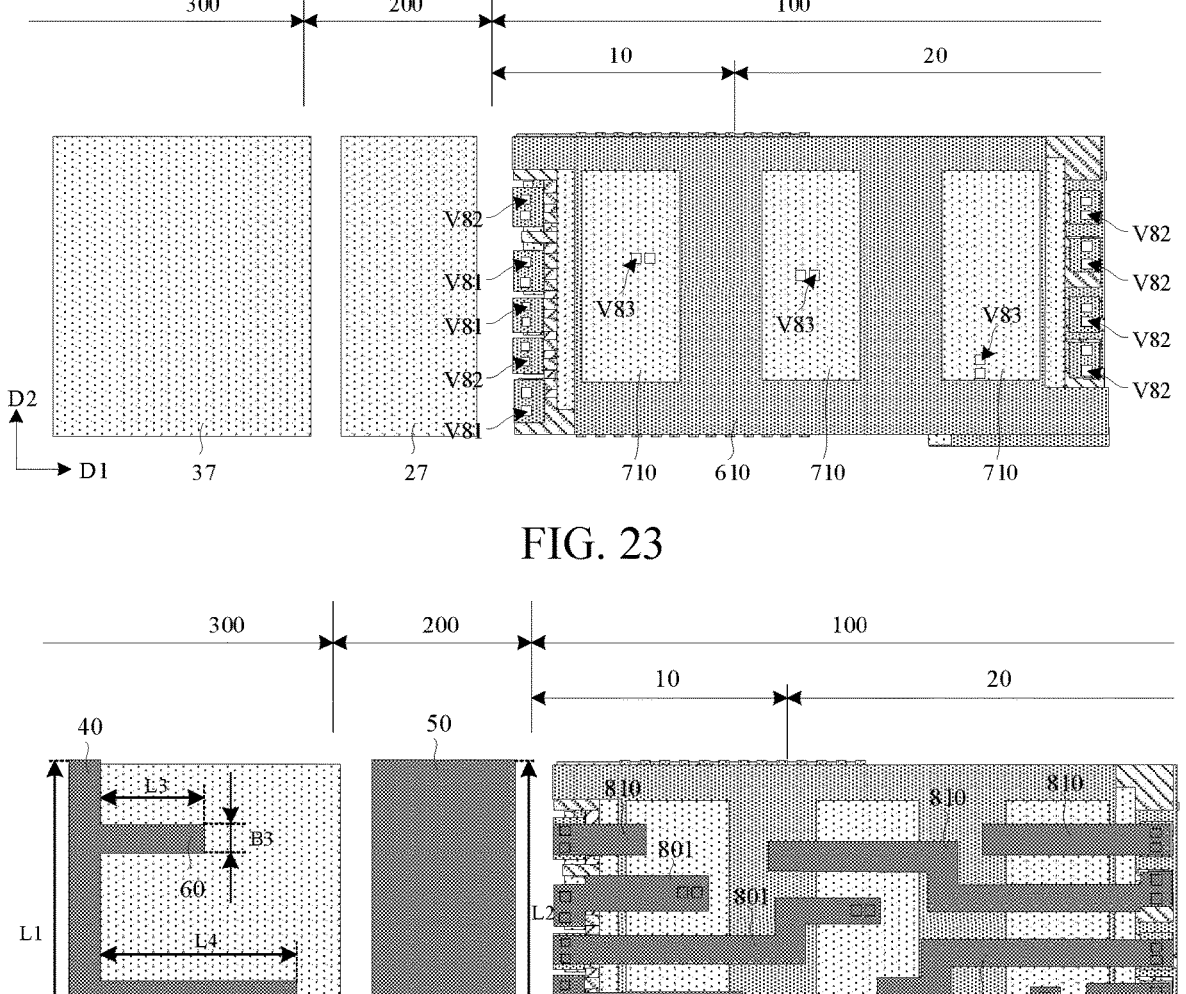
FIG. 23 is a schematic diagram after forming a pattern of an eighth insulation layer according to an embodiment of the present disclosure.
FIG. 24 is a schematic diagram after forming a pattern of an eighth conductive layer according to an embodiment of the present disclosure.

(15) A pattern of an eighth insulation layer is formed. In an exemplary implementation mode, forming the pattern of the eighth insulation layer may include: depositing an eighth insulation thin film on the silicon substrate on which the aforementioned patterns are formed, and patterning the eighth insulation thin film through a patterning process to form the eighth insulation layer overlaying the pattern of the seventh conductive layer. A plurality of vias are disposed on the eighth insulation layer, as shown in FIG. 23.

In an exemplary implementation mode, the plurality of vias may include an eighty-first via V81, an eighty-second via V82, and an eighty-third via V83.

In an exemplary implementation mode, an orthographic projection of the eighty-first via V81 on the silicon substrate is within a range of an orthographic projection of the seventy-first connection electrode 701 on the silicon substrate. The eighth insulation layer within the eighty-first via V81 is etched away to expose a surface of the seventy-first connection electrode 701. The eighty-first via V81 is configured to be connected with an eighty-first connection electrode formed subsequently.

In an exemplary implementation mode, an orthographic projection of the eighty-second via V82 on the silicon substrate is within a range of an orthographic projection of the seventy-second connection electrode 702 on the silicon substrate. The eighth insulation layer within the eighty-second via V82 is etched away to expose a surface of the seventy-second connection electrode 702. The eighty-second via V82 is configured to be connected with an anode connection electrode formed subsequently.

In an exemplary implementation mode, an orthographic projection of the eighty-third via V83 on the silicon substrate is within a range of an orthographic projection of the third electrode plate 710 on the silicon substrate. The eighth insulation layer within the eighty-third via V83 is etched away to expose a surface of the third electrode plate 710.

The eighty-third via V83 is configured to be connected with an eighty-first connection electrode formed subsequently.

After this process, the transition region 200 and the dummy region 300 may include: the silicon substrate, the first insulation layer and the second insulation layer stacked on the silicon substrate, the second transition line 22 and the second dummy line 32 disposed on the second insulation layer, the third insulation layer overlaying the second transition line 22 and the second dummy line 32, the third transition line 23 and the third dummy line 33 disposed on the third insulation layer, the fourth insulation layer overlaying the third transition line 23 and the third dummy line 33, the fourth transition line 24 and the fourth dummy line 34 disposed on the fourth insulation layer, the fifth insulation layer overlaying the fourth transition line 24 and the fourth dummy line 34, the fifth transition line 25 and the fifth dummy line 35 disposed on the fifth insulation layer, the sixth insulation layer overlaying the fifth transition line 25 and the fifth dummy line 35, the sixth transition line 26 and the sixth dummy line 36 disposed on the sixth insulation layer, the seventh insulation layer overlaying the sixth transition line 26 and the sixth dummy line 36, the seventh transition line 27 and the seventh dummy line 37 disposed on the seventh insulation layer, and the eighth insulation layer overlaying the seventh transition line 27 and the seventh dummy line 37.

(16) A pattern of an eighth conductive layer is formed. In an exemplary implementation mode, forming the pattern of the eighth conductive layer may include: depositing an eighth conductive thin film on the silicon substrate on which the aforementioned patterns are formed, patterning the eighth conductive thin film through a patterning process to form the pattern of the eighth conductive layer on the eighth insulation layer, as shown in FIG. 24. In an exemplary implementation mode, the eighth conductive layer may be referred to as a sixth metal (Metal6) layer.

In an exemplary implementation mode, the eighth conductive layer may at least include: an eighty-first connection electrode 801, an anode connection electrode 810, a second anode connection line 50, a third anode connection line 60, and a cathode voltage line 40.

In an exemplary implementation mode, the eighty-first connection electrode 801 may be in a shape of a fold line extending along the first direction D1. A first end of the eighty-first connection electrode 801 is connected with the seventy-first connection electrode 701 through the eighty-first via V81, and a second end of the eighty-first connection electrode 801 is connected with the third electrode plate 710 through the eighty-third via V83. Since the seventy-first connection electrode 701 is connected with the sixty-first connection electrode 601 through a via, the sixty-first connection electrode 601 is connected with the fifty-first connection electrode 501 through a via, the fifty-first connection electrode 501 is connected with the forty-first connection electrode 401 through a via, and the forty-first connection electrode 401 serves as the first node N1, the first node N1 is connected with the second electrode of the first transistor T1 and the third gate electrode 132 of the third transistor T3, mutual connections between the second electrode of the first transistor T1, the third gate electrode 132 of the third transistor T3, and the third electrode plate 710, which have a same potential, are achieved.

In an exemplary implementation mode, three first electrode plates 510 located in the fifth conductive layer serve as first capacitor plates of three storage capacitors, three third electrode plates 710 located in the seventh conductive layer serve as first capacitor plates of other three storage capacitors, and the second electrode plate 610 located in the sixth conductive layer serves as second capacitor plates of six storage capacitors, thus it is achieved that six storage capacitors are formed in one repetitive unit, a first capacitor plate of each of the storage capacitors is connected with the second electrode of the first transistor T1 and the third gate electrode 132 of the third transistor T3, and a second capacitor plate of each of the storage capacitors is connected with the cathode voltage line 40.

In an exemplary implementation mode, a plurality of anode connection electrodes 810 may be located in the display region 100. The plurality of anode connection electrodes 810 are connected with a plurality of seventy-second connection electrodes 701 through a plurality of eighty-second vias V82 respectively. The plurality of anode connection electrodes 810 are configured to be correspondingly connected with a plurality of first anodes formed subsequently in the display region 100.

In an exemplary implementation mode, the second anode connection line 50 may be located in the transition region 200. The second anode connection line 50 may be a monolithic metal layer extending along the second direction D2 (column direction). The second anode connection line 50 is configured to be correspondingly connected with a plurality of second anodes formed subsequently in the transition region 200.

In an exemplary implementation mode, the third anode connection line 60 may be located in the dummy region 300. The third anode connection line 60 may be in a shape of a strip, a main body portion of which extends along the first direction D1. A plurality of third anode connection lines 60 may be disposed in sequence along the second direction Y. The plurality of third anode connection lines 60 are configured to be correspondingly connected with a plurality of third anodes in the dummy region 300.

In an exemplary implementation mode, the cathode voltage line 40 may be located in the dummy region 300. The cathode voltage line 40 may be in a shape of a ring surrounding the transition region 200. The cathode voltage line 40 is configured to provide a common voltage (VCOM).

In an exemplary implementation mode, connection relationships between the cathode voltage line 40 and the second anode connection line 50 and the third anode connection line 60 may include any one or more of following: the second anode connection line 50 is connected with the cathode voltage line 40 through a corresponding connection line, the third anode connection line 60 is connected with the cathode voltage line 40 through a corresponding connection line, there is no connection between the second anode connection line 50 and the cathode voltage line 40, and there is no connection between the third anode connection line 60 and the cathode voltage line 40.

In an exemplary implementation mode, a second width B2 of the second anode connection line 50 may be greater than a first width B1 of the cathode voltage line 40. Both of the first width B1 and the second width B2 are sizes in the first direction D1 in FIG. 24.

In an exemplary implementation mode, the second width B2 of the second anode connection line 50 may be greater than a third width B3 of the third anode connection line 60. The third width B3 is a size in the second direction D2 in FIG. 24.

In an exemplary implementation mode, a second length L2 of the second anode connection line 50 may be less than a first extension length L1 of the cathode voltage line 40. The second length L2 is a size in the second direction D2 in FIG. 24, and the first extension length L1 is an extension length of the cathode voltage line 40 in the dummy region.

In an exemplary implementation mode, the second length L2 of the second anode connection line 50 may be greater than a third extension length L3 and a fourth extension length L4 of the third anode connection line 60. The third extension length L3 and the fourth extension length L4 each are an extension length of the third anode connection line 60 in the dummy region.

In an exemplary implementation mode, the third anode connection line 60 includes a first connection line having the third extension length L3 and a second connection line having the fourth extension length L4, the first connection line and the second connection line are alternately disposed along a second extension direction. For example, two third anode connection lines 60 with different extension lengths, which extend along the first direction D1 in FIG. 24, are alternately disposed in the second direction D2.

In an exemplary implementation mode, the third width B3 of the third anode connection line 60 may be less than the first width B1 of the cathode voltage line 40.

After this process, the transition region 200 and the dummy region 300 may include: the silicon substrate, the first insulation layer and the second insulation layer stacked on the silicon substrate, the second transition line 22 and the second dummy line 32 disposed on the second insulation layer, the third insulation layer overlaying the second transition line 22 and the second dummy line 32, the third transition line 23 and the third dummy line 33 disposed on the third insulation layer, the fourth insulation layer overlaying the third transition line 23 and the third dummy line 33, the fourth transition line 24 and the fourth dummy line 34 disposed on the fourth insulation layer, the fifth insulation layer overlaying the fourth transition line 24 and the fourth dummy line 34, the fifth transition line 25 and the fifth dummy line 35 disposed on the fifth insulation layer, the sixth insulation layer overlaying the fifth transition line 25 and the fifth dummy line 35, the sixth transition line 26 and the sixth dummy line 36 disposed on the sixth insulation layer, the seventh insulation layer overlaying the sixth transition line 26 and the sixth dummy line 36, the seventh transition line 27 and the seventh dummy line 37 disposed on the seventh insulation layer, the eighth insulation layer overlaying the seventh transition line 27 and the seventh dummy line 37, and the second anode connection line 50, the third anode connection line 60, and the cathode voltage line 40 disposed on the seventh insulation layer.

Figure 25:
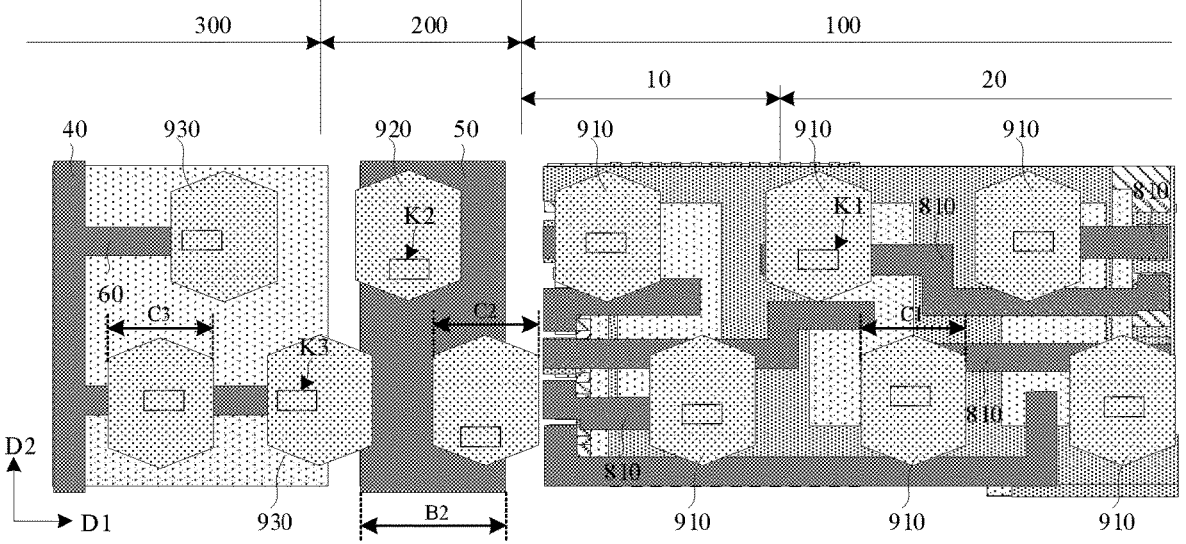
FIG. 25 is a schematic diagram after forming a pattern of an anode conductive layer according to an embodiment of the present disclosure.

(17) A pattern of an anode conductive layer is formed. In an exemplary implementation mode, forming the pattern of the anode conductive layer may include: first coating a planarization thin film on the silicon substrate on which the aforementioned patterns are formed, and patterning the planarization thin film through a patterning process to form a planarization layer overlaying the pattern of the eighth conductive layer. A plurality of vias are disposed on the planarization layer. The plurality of vias may include a display anode via K1, an orthographic projection of which on the silicon substrate is within a range of an orthographic projection of the anode connection electrode 810 on the silicon substrate, a transition anode via K2, an orthographic projection of which on the silicon substrate is within a range of an orthographic projection of the second anode connection line 50 on the silicon substrate, and a dummy anode via K3, an orthographic projection of which on the silicon substrate is within a range of an orthographic projection of the third anode connection line 60 on the silicon substrate. The planarization layer within a plurality of display anode vias K1, a plurality of transition anode vias K2, and a plurality of dummy anode vias K3 is etched away to expose surfaces of the anode connection electrode 810, the second anode connection line 50, and the third anode connection line 60 respectively. Subsequently, an anode conductive thin film is deposited on the silicon substrate on which the aforementioned patterns are formed, and the anode conductive thin film is patterned through a patterning process to form the pattern of the anode conductive layer disposed on the planarization layer. The pattern of the anode conductive layer at least includes a first anode 910, a second anode 920, and a third anode 930, as shown in FIG. 25.

In an exemplary implementation mode, a plurality of first anodes 910 may be located in the display region 100. The plurality of the first anodes 910 are connected correspondingly with the plurality of anode connection electrodes 810 through the plurality of display anode vias K1 respectively. Since the anode connection electrode 810 is connected with the seventy-second connection electrode 701 through a via, the seventy-second connection electrode 701 is connected with the sixty-second connection electrode 602 through a via, the sixty-second connection electrode 602 is connected with the fifty-second connection electrode 502 through a via, the fifty-second connection electrode 502 is connected with the forty-second connection electrode 402 through a via, the forty-second connection electrode 402 is connected with the thirty-second connection electrode 302 through a via, the thirty-second connection electrode 302 is connected with the twenty-fourth connection electrode 204 through a via, and the twenty-fourth connection electrode 204 is connected with the second region of the second active layer through a via, corresponding connections between the plurality of first anodes 910 and second electrodes of a plurality of second transistors T2 are achieved, and a current output by a second transistor T2 may be output to a first anode 910 in the display region 100.

In an exemplary implementation mode, a plurality of second anodes 920 may be located in the transition region 200. The plurality of second anodes 920 are connected with a plurality of second anode connection lines 50 through the plurality of transition anode vias K2 respectively. When a second anode connection line 50 is connected with the cathode voltage line 40, the cathode voltage line 40 provides a common voltage to the plurality of second anodes 920. When the second anode connection line 50 is not connected with the cathode voltage line 40, the plurality of second anodes 920 are in a floating state.

In an exemplary implementation mode, a plurality of third anodes 930 may be located in the dummy region 300. The plurality of third anodes 930 are connected with a plurality of third anode connection lines 60 through the plurality of dummy anode vias K3 respectively. When a third anode connection line 60 is connected with the cathode voltage line 40, the cathode voltage line 40 provides a common voltage to the plurality of third anodes 930. When the third anode connection line 60 is not connected with the cathode voltage line 40, the plurality of third anodes 930 are in a floating state.

In an exemplary implementation mode, a quantity of third anodes 930 in the dummy region 300 is different from a quantity of second anodes 920 in the transition region 200, i.e., a quantity of dummy light emitting devices in the dummy region 300 is different from a quantity of transition light emitting devices in the transition region 200.

In an exemplary implementation mode, a quantity of third anodes 930 in the dummy region 300 is greater than a quantity of second anodes 920 in the transition region 200, i.e., a quantity of dummy light emitting devices in the dummy region 300 is greater than a quantity of transition light emitting devices in the transition region 200.

In an exemplary implementation mode, an orthographic projection of at least one third anode 930 in the dummy region 300 on a plane of the display apparatus is at least partially overlapped with an orthographic projection of a second anode connection line 50 on the plane of the display apparatus, i.e., an orthographic projection of at least one dummy light emitting device in the dummy region 300 on the plane of the display apparatus is at least partially overlapped with the orthographic projection of the second anode connection line 50 on the plane of the display apparatus.

In an exemplary implementation mode, an orthographic projection of at least one second anode 920 in the transition region 200 on a plane of the display apparatus is not overlapped with an orthographic projection of a third anode connection line 60 on the plane of the display apparatus, i.e., an orthographic projection of at least one transition light emitting device in the transition region 200 on the plane of the display apparatus is not overlapped with the orthographic projection of the third anode connection line 60 on the plane of the display apparatus.

In an exemplary implementation mode, a dummy anode via K3 and a transition anode via K2 are not on a same straight line along the first direction D1 (row direction).

In an exemplary implementation mode, on both sides of the first direction D1 (row direction) of the display apparatus, the plurality of second anodes 920 in the transition region 200 and the plurality of third anodes 930 in the dummy region 300 may form three columns of anodes, and each column of anodes includes a plurality of second anodes 920 or a plurality of third anodes 930 disposed in sequence along the second direction D2 (column direction). Thus, the transition region 200 and the dummy region 300 include three columns of light emitting devices, and each column of light emitting devices includes a plurality of dummy light emitting devices or a plurality of transition light emitting devices disposed in sequence along the column direction.

In an exemplary implementation mode, on both sides of the second direction D2 (column direction) of the display apparatus, the plurality of third anodes 930 in the dummy region 300 may form two rows of anodes, and each row of anodes includes a plurality of third anodes 930 disposed in sequence along the first direction D1 (row direction). Thus, the dummy region 300 includes two rows of light emitting devices, and each row of light emitting devices includes a plurality of dummy light emitting devices disposed in sequence along the row direction.

In an exemplary implementation mode, a second width B2 of a second anode connection line 50 may be greater than a first anode width C1 of a first anode 910, the second width B2 of the second anode connection line 50 may be greater than a second anode width C2 of a second anode 920, and the second width B2 of the second anode connection line 50 may be greater than a third anode width C3 of a third anode 930. The first anode width C1, the second anode width C2, and the third anode width C3 are all sizes in the first direction D1 in FIG. 24. Thus, the second width B2 of the second anode connection line 50 may be larger than a width of a pixel opening in the display region, may be larger than a width of a pixel opening in the transition region, and may be larger than a width of a pixel opening in the dummy region.

In an exemplary implementation mode, the first anode width C1 of the first anode 910, the second anode width C2 of the second anode 920, and the third anode width C3 of the third anode 930 may be substantially the same.

Subsequent preparation processes may include processes such as forming a pixel definition layer, an organic emitting layer, a cathode, a first encapsulation layer, a color film structure layer, and a second encapsulation layer.

In an exemplary implementation mode, forming patterns of the pixel definition layer, the organic emitting layer, and the cathode may include: first coating a pixel definition thin film on the silicon substrate on which the aforementioned patterns are formed, patterning the pixel definition thin film through a patterning process to form the pixel definition layer overlaying the pattern of the anode conductive layer. A plurality of pixel openings are formed in the pixel definition layer. The pixel opening in the display region 100 exposes the first anode 910, the pixel opening in the transition region 200 exposes the second anode 920, and the pixel opening in the dummy region 300 exposes the third anode 930. Subsequently, a pattern of the organic emitting layer is formed using an evaporation process or an inkjet printing process. The pattern of the organic emitting layer may include a first emitting layer located in the display region 100, a second emitting layer located in the transition region 200, and a third emitting layer located in the dummy region 300. The first emitting layer is connected with the first anode 910 through the pixel opening, the second emitting layer is connected with the second anode 920 through the pixel opening, and the third emitting layer is connected with the third anode 930 through the pixel opening. Subsequently, a pattern of the cathode is formed using an evaporation process. The pattern of the cathode may include a first cathode located in the display region 100, a second cathode located in the transition region 200, and a third cathode located in the dummy region 300. The first cathode is connected with the first emitting layer and the cathode voltage line 40, the second cathode is connected with the second emitting layer and the cathode voltage line 40, and the third cathode is connected with the third emitting layer and the cathode voltage line 40. In an exemplary implementation mode, the first cathode, the second cathode, and the third cathode may be connected with each other to form an integrated structure, i.e., the pattern of the cathode may be of a monolithic structure and the cathode is connected with the cathode voltage line 40. Subsequently, processes such as the first encapsulation layer, the color film structure layer, and the second encapsulation layer are performed, which will not be repeated herein.

A structure of the display apparatus and the preparation process thereof according to exemplary embodiments of the present disclosure are described by way of example only. Corresponding structures may be changed and patterning processes may be added or reduced according to actual needs, the present disclosure is not limited thereto.

In an exemplary implementation mode, the first insulation thin film to the eighth insulation thin film may be made of Silicon Oxide (SiOx), Silicon Nitride (SiNx), or Silicon Oxynitride (SiON), and may be of a single-layered structure or may be of a multi-layer composite structure. The first metal layer to the sixth metal layer may be made of a metal material, such as Argentum (Ag), Copper (Cu), Aluminum (Al), or Molybdenum (Mo), or may be made of an alloy material consisting of metals, such as Aluminum Neodymium (AlNd) alloy or Molybdenum Niobium (MoNb) alloy, and may be of a single-layer structure or may be of a multi-layer composite structure, such as a composite structure consisting of an Mo layer, a Cu layer, and an Mo layer.

In an exemplary implementation mode, a plane shape of a via may be a rectangle, a circle, or an ellipse. Sizes of a plurality of vias may be the same or different, and the present disclosure is not limited thereto.

In a display apparatus, usually, an anode of a dummy light emitting device is configured to be connected with a ground line, and a cathode of the dummy light emitting device is configured to be connected with a cathode voltage line. Researches have shown that this design structure has some problems, such as light leakage in an edge region. In a high crossing voltage design structure, if a crossing voltage is about 9.5 V, a potential of a cathode voltage line will be set to −7.5 V, so that a voltage difference between a cathode and an anode of a dummy light emitting device will reach 7.5 V, which exceeds a light-up voltage of an organic emitting layer, resulting in a problem of light leakage in an edge region due to light emitting of the dummy light emitting device.

It may be seen from the structure of the display apparatus and the preparation process thereof according to the exemplary embodiments of the present disclosure, in the present disclosure, light leakage in an edge region is effectively improved by providing an anode connection line, which is connected with anodes in a transition region and a dummy region, in the transition region and the dummy region. In an exemplary embodiment, an anode connection line may be connected with a cathode voltage line so that anodes and cathodes of a transition light emitting device and a dummy light emitting device have a same potential, and even in a case of a high crossing voltage, since a crossing voltage between an anode and a cathode is zero, it may be ensured that the transition light emitting device and the dummy light emitting device will not emit light. In another exemplary embodiment, an anode connection line may be in a floating state so that a voltage difference will not be formed between anodes and cathodes of a transition light emitting device and a dummy light emitting device, and even in a case of a high crossing voltage, it may be ensured that the transition region light emitting device and the dummy light emitting device will not emit light. In the present disclosure, light leakage in an edge region is effectively improved, display mura caused by light leakage is avoided effectively, which is beneficial to improving display uniformity of the display apparatus and achieving a display effect with higher uniformity, improving display quality of the display apparatus, and enhancing visual experiences of customers. In the present disclosure, six pixel drive circuits are disposed in one repetitive unit, so that not only an integration level is high and a pixel layout is more compact, an utilization rate of space is improved, and a resolution of the display apparatus is improved, but also uniformity of process errors may be improved and a product yield may be improved. In the present disclosure, through an optimized design of a layout of pixel drive circuits, layout space is fully utilized, arrangement of transistors is optimized reasonably, a smaller layout area is achieved, an occupied area of the pixel drive circuits may be reduced, and a higher PPI and better display quality may be achieved.

In an exemplary implementation mode, the display apparatus according to the present disclosure may include, but is not limited to, an OLED display apparatus or a QLED display apparatus, and may be used for a virtual reality device or an enhanced display device. The display apparatus may include, but is not limited to, a mobile phone, a tablet computer, a television, a display, a notebook computer, a digital photo frame, a navigator, or any product or component with a display function.

An exemplary embodiment of the present disclosure also provides a preparation method of a display apparatus. In an exemplary implementation mode, the display apparatus includes a display region and a dummy region located on at least one side of the display region. The preparation method includes: forming a cathode voltage line, at least one dummy anode connection line, and a plurality of dummy light emitting devices in the dummy region, wherein a dummy light emitting device includes a dummy anode, a dummy cathode, and a dummy emitting layer disposed between the dummy anode and the dummy cathode, the dummy cathode is connected with the cathode voltage line, and the dummy anode is connected with the dummy anode connection line.

Although implementation modes disclosed in the present disclosure are as above, the above contents are only used for convenience of understanding the present disclosure, and are not used for limiting the present disclosure. Any person skilled in the art to which the present disclosure belongs may make any modification and change in a form and details of implementation without departing from the spirit and scope of the present disclosure, but the scope of patent protection of the present disclosure shall still be subject to the scope defined in the appended claims.

The invention claimed is:

1. A display apparatus, comprising a display region and a dummy region located on at least one side of the display region, wherein the display region comprises a plurality of pixel drive circuits and a plurality of display light emitting devices, a display light emitting device comprises a display anode, a display cathode, and a display emitting layer disposed between the display anode and the display cathode; the dummy region comprises a cathode voltage line, at least one dummy anode connection line, and a plurality of dummy light emitting devices, a dummy light emitting device comprises a dummy anode, a dummy cathode, and a dummy emitting layer disposed between the dummy anode and the dummy cathode; both the display cathode and the dummy cathode are connected with the cathode voltage line, the display anode is connected with a pixel drive circuit, the dummy anode is connected with the dummy anode connection line, and the dummy anode connection line is configured such that a voltage difference between the dummy anode and the dummy cathode is less than a light-up voltage of the dummy light emitting device.

2. The display apparatus according to claim 1, wherein the dummy anode connection line is connected with the cathode voltage line.

3. The display apparatus according to claim 1, wherein the dummy anode connection line is in a shape of a strip extending along a first extension direction, a plurality of dummy anode connection lines are disposed in sequence along a second extension direction, the first extension direction is a direction away from the display region, and the second extension direction is a direction perpendicular to the first extension direction.

4. The display apparatus according to claim 3, wherein the dummy anode connection line comprises a first connection line and a second connection line with different extension lengths, and the first connection line and the second connection line are disposed alternately along the second extension direction.

5. The display apparatus according to claim 1, wherein the display apparatus further comprises a transition region, the transition region is located between the display region and the dummy region, the transition region comprises a transition anode connection line and a plurality of transition light emitting devices, a transition light emitting device comprises a transition anode, a transition cathode, and a transition emitting layer disposed between the transition anode and the transition cathode, the transition cathode is connected with the cathode voltage line, the transition anode is connected with the transition anode connection line, the transition anode connection line is a monolithic metal layer extending along a column direction, and the transition anode connection line is configured such that a voltage difference between the transition anode and the transition cathode is less than a light-up voltage of the transition light emitting device.

6. The display apparatus according to claim 5, wherein the transition anode connection line is connected with the cathode voltage line.

7. The display apparatus according to claim 5, wherein a width of the transition anode connection line is greater than a width of the cathode voltage line;
or, a width of the transition anode connection line is greater than a width of the dummy anode connection line;
or, a width of the transition anode connection line is greater than a width of the transition anode.

8. The display apparatus according to claim 5, wherein a length of the transition anode connection line is less than an extension length of the cathode voltage line;
or, a length of the transition anode connection line is greater than an extension length of the dummy anode connection line.

9. The display apparatus according to claim 5, wherein a width of the dummy anode connection line is less than a width of the cathode voltage line.

10. The display apparatus according to claim 5, wherein a quantity of dummy light emitting devices in the dummy region is different from a quantity of transition light emitting devices in the transition region.

11. The display apparatus according to claim 10, wherein a quantity of dummy light emitting devices in the dummy region is greater than a quantity of transition light emitting devices in the transition region.

12. The display apparatus according to claim 5, wherein an orthographic projection of at least one dummy light emitting device on a plane of the display apparatus is at least partially overlapped with an orthographic projection of the transition anode connection line on the plane of the display apparatus.

13. The display apparatus according to claim 5, wherein an orthographic projection of at least one transition light emitting device on a plane of the display apparatus is not overlapped with an orthographic projection of the dummy anode connection line on the plane of the display apparatus.

14. The display apparatus according to claim 5, wherein the transition anode is connected with the transition anode connection line through a transition anode via, and the dummy anode is connected with the dummy anode connection line through a dummy anode via, and the dummy anode via and the transition anode via are not on a same straight line along a row direction.

15. The display apparatus according to claim 5, wherein on both sides of the display apparatus in a row direction, the transition region and the dummy region comprise three columns of light emitting devices, and each column of light emitting devices comprises a plurality of dummy light emitting devices or a plurality of transition light emitting devices disposed in sequence along a column direction.

16. The display apparatus according to claim 5, wherein on both sides of the display apparatus in a column direction, the dummy region comprises two rows of light emitting devices, and each row of light emitting devices comprises a plurality of dummy light emitting devices disposed in sequence along a row direction.

17. The display apparatus according to claim 1, wherein on a plane perpendicular to the display apparatus, the display apparatus comprises a silicon substrate, a drive circuit layer disposed on the silicon substrate, and a light emitting structure layer disposed on one side of the drive circuit layer away from the silicon substrate; the drive circuit layer comprises a first conductive layer, a second conductive layer, a third conductive layer, a fourth conductive layer, a fifth conductive layer, a sixth conductive layer, a seventh conductive layer, and an eighth conductive layer disposed in sequence on the silicon substrate, and the cathode voltage line is disposed in the eighth conductive layer.

18. The display apparatus according to claim 17, wherein the transition anode connection line, the dummy anode connection line, and the cathode voltage line are disposed in a same layer.

19. The display apparatus according to claim 17, wherein the drive circuit layer in the display region comprises a plurality of repetitive units, at least one repetitive unit comprises a plurality of pixel drive circuits, at least one pixel drive circuit comprises a first transistor, a second transistor, a third transistor, and a storage capacitor, a control electrode of the first transistor is connected with a scan signal line, a first electrode of the first transistor is connected with a data signal line, a control electrode of the second transistor is connected with a reference signal line, a control electrode of the third transistor is connected with a first capacitor plate of the storage capacitor, a first electrode of the third transistor is connected with a first power supply line, and a second capacitor plate of the storage capacitor is connected with the cathode voltage line; the scan signal line and the reference signal line are disposed in the second conductive layer, the data signal line is disposed in the third conductive layer, and the first power supply line is disposed in the fourth conductive layer.

20. The display apparatus according to claim 19, wherein in the repetitive unit, the first capacitor plate of the storage capacitor of the at least one pixel drive circuit is disposed in the fifth conductive layer, and the second capacitor plate of the storage capacitor is disposed in the sixth conductive layer;

or, in the repetitive unit, the first capacitor plate of the storage capacitor of the at least one pixel drive circuit is disposed in the seventh conductive layer, and the second capacitor plate of the storage capacitor is disposed in the sixth conductive layer.

* * * * *